United States Patent
Suzuki

(10) Patent No.: US 10,720,208 B2
(45) Date of Patent: Jul. 21, 2020

(54) SEMICONDUCTOR MEMORY DEVICE

(71) Applicant: Toshiba Memory Corporation, Minato-ku (JP)

(72) Inventor: Shinji Suzuki, Sagamihara (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/298,556

(22) Filed: Mar. 11, 2019

(65) Prior Publication Data
US 2020/0090741 A1   Mar. 19, 2020

(30) Foreign Application Priority Data
Sep. 18, 2018 (JP) .................... 2018-173597

(51) Int. Cl.
| | | |
|---|---|---|
| *G11C 11/56* | (2006.01) | |
| *H01L 27/11556* | (2017.01) | |
| *H01L 27/11582* | (2017.01) | |
| *G06F 11/10* | (2006.01) | |
| *G11C 29/52* | (2006.01) | |

(52) U.S. Cl.
CPC ...... *G11C 11/5628* (2013.01); *G06F 11/1068* (2013.01); *G11C 11/5671* (2013.01); *G11C 29/52* (2013.01); *H01L 27/11556* (2013.01); *H01L 27/11582* (2013.01); *G11C 2211/5621* (2013.01)

(58) Field of Classification Search
None
See application file for complete search history.

(56) References Cited

U.S. PATENT DOCUMENTS

| | | | |
|---|---|---|---|
| 8,223,555 B2 | 7/2012 | Kim et al. | |
| 8,717,823 B2 | 5/2014 | Kim et al. | |
| 9,466,389 B2 * | 10/2016 | Ahn | ............... G11C 16/34 |
| 9,640,265 B1 | 5/2017 | Honma | |
| 10,037,813 B2 | 7/2018 | Maejima et al. | |
| 2005/0083735 A1 * | 4/2005 | Chen | ............... G11C 16/10 |
| | | | 365/185.17 |
| 2018/0315486 A1 | 11/2018 | Maejima et al. | |

FOREIGN PATENT DOCUMENTS

JP   2017-142874   8/2017

* cited by examiner

*Primary Examiner* — James G Norman
(74) *Attorney, Agent, or Firm* — Oblon, McClelland, Maier & Neustadt, L.L.P.

(57) ABSTRACT

A semiconductor memory device according to an embodiment includes a memory cell array having plural memory cells that can be set to any one of plural different threshold voltages, plural bit lines connected to the plural memory cells respectively, a word line connected to gates of the plural memory cells, a control unit configured to execute a write sequence for repetitively performing plural loops including a set of a program operation of writing data into the memory cells and a verify operation of verifying data written in the memory cells to write predetermined data in the memory cells MT, and prior to execution of the write sequence, the control unit corrects the write sequence based on a result of performing the preliminary program operation and the detection verify operation on the memory cells.

7 Claims, 26 Drawing Sheets

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 9

| VERIFY TARGET LEVEL \ LOOP NUMBER | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL (VfyA) | O | O | O | O |   |   |   |   |   |   |   |   |   |   |   |   |   |   |   |
| "B" LEVEL (VfyB) |   | O | O | O | O | O |   |   |   |   |   |   |   |   |   |   |   |   |   |
| "C" LEVEL (VfyC) |   |   | O | O | O | O | O | O |   |   |   |   |   |   |   |   |   |   |   |
| "D" LEVEL (VfyD) |   |   |   |   | O | O | O | O | O | O |   |   |   |   |   |   |   |   |   |
| "E" LEVEL (VfyE) |   |   |   |   |   |   | O | O | O | O | O | O |   |   |   |   |   |   |   |
| "F" LEVEL (VfyF) |   |   |   |   |   |   |   |   | O | O | O | O | O | O | O | O |   |   |   |
| "G" LEVEL (VfyG) |   |   |   |   |   |   |   |   |   |   | O | O | O | O | O | O | O | O | O |

FIG. 10

| WRITE TARGET LEVEL \ LOOP NUMBER | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" LEVEL (inhibit) | 1 | 1 | 1 | 1 | 1 | 1 | 1 | 1 | 1 | 1 | 1 | 1 | 1 | 1 | 1 | 1 | 1 | 1 | 1 |
| "A" LEVEL | 0 | 0/1 | 0/1 | 0/1 | 0/1 | 0/1 | 1 | 1 | 1 | 1 | 1 | 1 | 1 | 1 | 1 | 1 | 1 | 1 | 1 |
| "B" LEVEL | 0 | 0 | 0 | 0/1 | 0/1 | 0/1 | 0/1 | 0/1 | 1 | 1 | 1 | 1 | 1 | 1 | 1 | 1 | 1 | 1 | 1 |
| "C" LEVEL | 0 | 0 | 0 | 0 | 0 | 0/1 | 0/1 | 0/1 | 0/1 | 0/1 | 1 | 1 | 1 | 1 | 1 | 1 | 1 | 1 | 1 |
| "D" LEVEL | 0 | 0 | 0 | 0 | 0 | 0 | 0 | 0/1 | 0/1 | 0/1 | 0/1 | 0/1 | 1 | 1 | 1 | 1 | 1 | 1 | 1 |
| "E" LEVEL | 0 | 0 | 0 | 0 | 0 | 0 | 0 | 0 | 0 | 0/1 | 0/1 | 0/1 | 0/1 | 0/1 | 1 | 1 | 1 | 1 | 1 |
| "F" LEVEL | 0 | 0 | 0 | 0 | 0 | 0 | 0 | 0 | 0 | 0 | 0 | 0/1 | 0/1 | 0/1 | 0/1 | 0/1 | 1 | 1 | 1 |
| "G" LEVEL | 0 | 0 | 0 | 0 | 0 | 0 | 0 | 0 | 0 | 0 | 0 | 0 | 0 | 0 | 0/1 | 0/1 | 0/1 | 0/1 | 0/1 |

FIG. 13

| LOOP | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| VPGM[V] | 12.0 | 12.5 | 13.0 | 13.5 | 14.0 | 14.5 | 15.0 | 15.5 | 16.0 | 16.5 | 17.0 | 17.5 | 18.0 | 18.5 | 19.0 | 19.5 | 20.0 | 20.5 | 21.0 |

FIG. 16

| VERIFY TARGET LEVEL \ LOOP NUMBER | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL (VfyA) | — | O | O | O | O | O | | | | | | | | | | | | | |
| "B" LEVEL (VfyB) | | | — | O | O | O | O | O | | | | | | | | | | | |
| "C" LEVEL (VfyC) | | | | | — | O | O | O | O | O | | | | | | | | | |
| "D" LEVEL (VfyD) | | | | | | | — | O | O | O | O | O | | | | | | | |
| "E" LEVEL (VfyE) | | | | | | | | | O | O | O | O | O | O | | | | | |
| "F" LEVEL (VfyF) | | | | | | | | | | | — | O | O | O | O | O | | | |
| "G" LEVEL (VfyG) | | | | | | | | | | | | | | — | O | O | O | O | O |

FIG. 17

| LOOP | | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| VPGM[V] | 16.0 | 12.5±α | 13.0±α | 13.5±α | 14.0±α | 14.5±α | 15.0±α | 15.5±α | 16.0±α | 16.5±α | 17.0±α | 17.5±α | 18.0±α | 18.5±α | 19.0±α | 19.5±α | 20.0±α | 20.5±α | 21.0±α |

PRELIMINARY WRITING

FIG. 19

| VERIFY TARGET LEVEL \ LOOP NUMBER | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" LEVEL (VfyA) | — | — | ○ | ○ | ○ | ○ | | | | | | | | | | | | | |
| "B" LEVEL (VfyB) | | — | — | — | ○ | ○ | ○ | ○ | | | | | | | | | | | |
| "C" LEVEL (VfyC) | | | | — | — | — | ○ | ○ | ○ | ○ | | | | | | | | | |
| "D" LEVEL (VfyD) | | | | | | — | — | — | ○ | ○ | ○ | ○ | | | | | | | |
| "E" LEVEL (VfyE) | | | | | | | | — | — | — | ○ | ○ | ○ | ○ | | | | | |
| "F" LEVEL (VfyF) | | | | | | | | | | — | — | — | ○ | ○ | ○ | ○ | | | |
| "G" LEVEL (VfyG) | | | | | | | | | | | | — | — | — | — | ○ | ○ | ○ | ○ |

FIG. 20

| LOOP | PRELIMINARY | | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| VPGM[V] | 16.0 | | 13.0±α | 13.5±α | 14.0±α | 14.5±α | 15.0±α | 15.5±α | 16.0±α | 16.5±α | 17.0±α | 17.5±α | 18.0±α | 18.5±α | 19.0±α | 19.5±α | 20.0±α | 20.5±α | 21.0±α |

FIG. 22

| LOOP | PRELIMINARY | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|
| VPGM[V] | 12.0 | 13.0±α | 13.5±α | 14.0±α | 14.5±α | 15.0±α | 15.5±α | 16.0±α | 16.5±α | 17.0±α | 17.5±α | 18.0±α | 18.5±α | 19.0±α | 19.5±α | 20.0±α | 20.5±α | 21.0±α |

FIG. 24

| LOOP | PRELIMINARY 1 | PRELIMINARY 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| VPGM[V] | 12.0 | 16.0 | 13.0 ± α | 13.5 ± α | 14.0 ± α | 14.5 ± α | 15.0 ± α | 15.5 ± α | 16.0 ± α | 16.5 ± α | 17.0 ± α | 17.5 ± α | 18.0 ± α | 18.5 ± α | 19.0 ± α | 19.5 ± α | 20.0 ± α | 20.5 ± α | 21.0 ± α |

FIG. 27

| LOOP | PRELIMINARY 1 | PRELIMINARY 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| VPGM[V] | 12.0 | 16.0 $\pm \alpha$ | 13.0 $\pm \alpha$ | 13.5 $\pm \alpha$ | 14.0 $\pm \alpha$ | 14.5 $\pm \alpha$ | 15.0 $\pm \alpha$ | 15.5 $\pm \alpha$ | 16.0 $\pm \alpha$ | 16.5 $\pm \alpha$ | 17.0 $\pm \alpha$ | 17.5 $\pm \alpha$ | 18.0 $\pm \alpha$ | 18.5 $\pm \alpha$ | 19.0 $\pm \alpha$ | 19.5 $\pm \alpha$ | 20.0 $\pm \alpha$ | 20.5 $\pm \alpha$ | 21.0 $\pm \alpha$ |

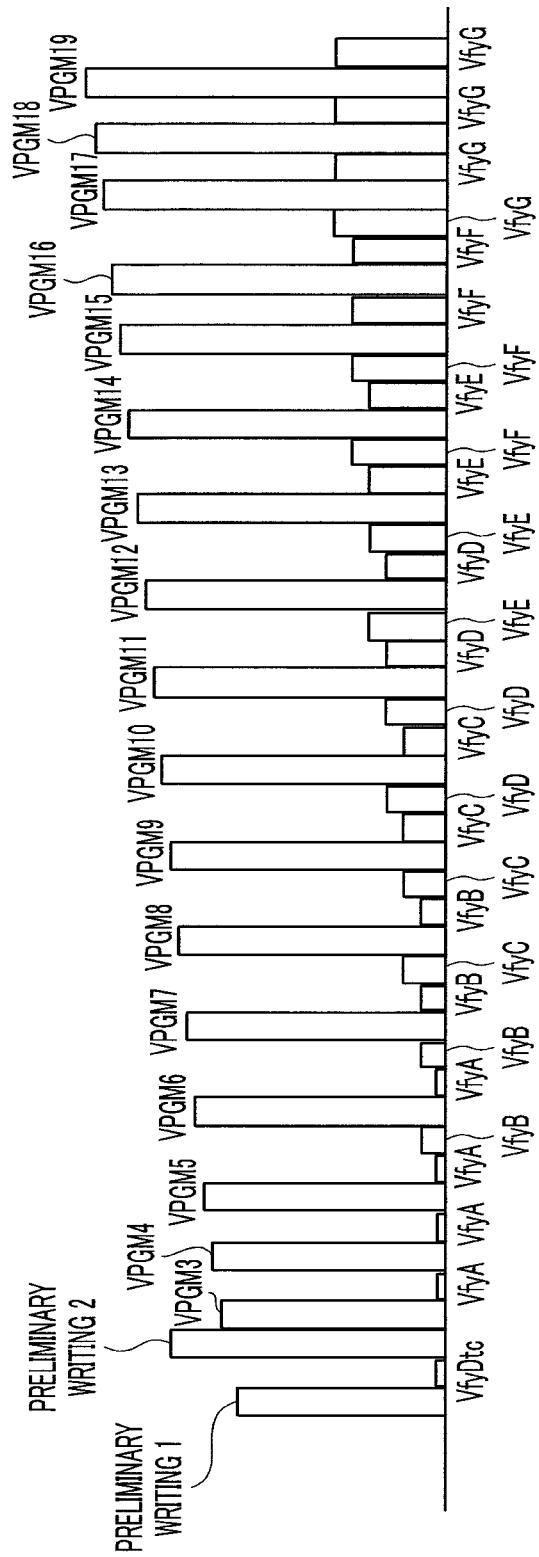

SEMICONDUCTOR MEMORY DEVICE

CROSS-REFERENCE TO RELATED APPLICATIONS

This application is based upon and claims the benefit of priority from the prior Japanese Patent Application No. 2018-173597 filed on Sep. 18, 2018; the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 9 is a diagram showing the relationship between a loop number and a program operation/verify operation during a write operation based on a standard write sequence;

FIG. 10 is a diagram showing the relationship between the loop number and the voltages of bit lines during the write operation based on the standard write sequence;

FIG. 13 is a diagram showing an example of the voltage of the selected word line during the write operation based on the standard write sequence;

FIG. 16 is a diagram showing an example of the relationship between a loop number and a program operation/verify operation during a write operation of a semiconductor memory device in the first embodiment;

FIG. 17 is a diagram showing an example of the voltage of a selected word line during the write operation of the semiconductor memory device in the first embodiment;

FIG. 19 is a diagram showing another example of the relationship between the loop number and the program operation/verify operation during the write operation based on the semiconductor memory device in the first embodiment;

FIG. 20 is a diagram showing another example of the voltage of the selected word line during the write operation of the semiconductor memory device in the first embodiment;

FIG. 22 is a diagram showing an example of the voltage of a selected word line during a write operation of a semiconductor storage device in a second embodiment;

FIG. 24 is a diagram showing an example of the voltage of a selected word line during a write operation of a semiconductor storage device in a third embodiment;

FIG. 27 is a diagram showing an example of a selected word line during the write operation of the semiconductor memory device in the fourth embodiment; and FIG. 28 is a diagram showing an example of a program operation and a verify operation during the write operation of the semiconductor memory device in the fourth embodiment.

DETAILED DESCRIPTION

A semiconductor memory device according to an embodiment includes a memory cell array including a plurality of memory cells each of which can be set to any one of at least four different threshold voltages, a plurality of bit lines connected to the plurality of memory cells respectively, a word line connected to gates of the plurality of memory cells, and a control unit configured to execute a write sequence to write predetermined data into the memory cells, the write sequence including a plurality of loops each comprising a set of a program operation to write data into the respective memory cells and a verify operation to verify the data written in the respective memory cells, wherein prior to execution of the write sequence, the control unit performs a preliminary program operation and a detection verify operation on the memory cells, and corrects the write sequence based on a result of the detection verify operation.

Embodiments will be described hereinafter with reference to the drawings.

First Embodiment (1. Configuration)
(1-1. Configuration of Memory System)

Figure 1:
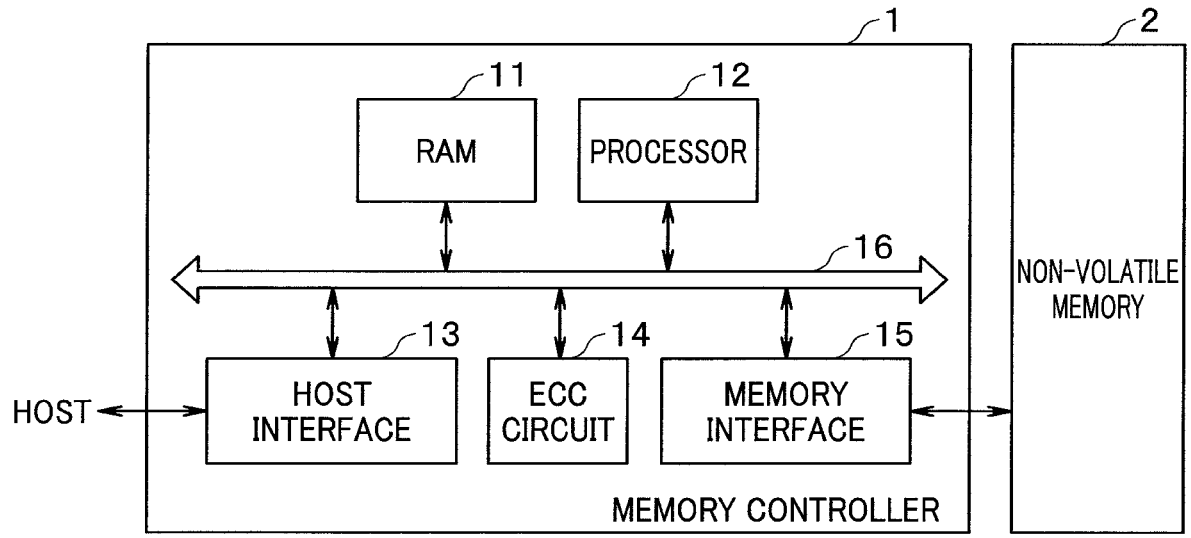
FIG. 1 is a block diagram showing a configuration example of a memory system according to an embodiment of the present invention.

FIG. 1 is a block diagram showing a configuration example of a memory system according to an embodiment of the present invention. The memory system according to the present embodiment includes a memory controller 1 and a non-volatile memory 2 as a semiconductor memory device. The memory system can be connected to a host. The host is, for example, an electronic device such as a personal computer or a portable terminal.

The non-volatile memory 2 is a memory configured to store data in a non-volatile manner, and includes, for example, a NAND memory (NAND flash memory). In the present embodiment, the non-volatile memory 2 will be described as a NAND memory having memory cells capable of storing 3 bits per memory cell, that is, 3 bit/Cell (TLC: triple level cell). The non-volatile memory 2 is three-dimensionally configured.

The memory controller 1 controls writing of data into the non-volatile memory 2 according to a write request from the host. Furthermore, the memory controller 1 controls reading of data from the non-volatile memory 2 according to a read request from the host. The memory controller 1 includes a RAM (random access memory) 11, a processor 12, a host interface 13, an ECC (error check and correct) circuit 14, and a memory interface 15. The RAM 11, the processor 12, the host interface 13, the ECC circuit 14 and the memory interface 15 are connected to one another via an internal bus 16.

The host interface 13 outputs a request, user data (write-target data), and the like received from the host to the internal bus 16. Furthermore, the host interface 13 transmits user data read out from the non-volatile memory 2, a response from the processor 12, and the like to the host.

The memory interface 15 controls processing of writing user data and the like into the non-volatile memory 2 and processing of reading user data and the like from the non-volatile memory 2 based on an instruction from the processor 12.

The processor 12 totally controls the memory controller 1. The processor 12 is, for example, a CPU (central processing unit), an MPU (micro processing unit), or the like. When the processor 12 receives a request from the host via the host interface 13, the processor 12 performs control according to the request. For example, the processor 12 instructs the memory interface 15 to write user data and a parity into the non-volatile memory 2 according to a request from the host. The processor 12 instructs the memory interface 15 to read user data and a parity from the non-volatile memory 2 according to a request from the host.

The processor 12 determines a storage area (memory area) on the non-volatile memory 2 for user data to be stored in the RAM 11. The user data is stored in the RAM 11 via the internal bus 16. The processor 12 determines the memory area on a page (page data) basis. The page is a unit of writing and reading data. In this specification, user data to be stored in one page of the non-volatile memory 2 is defined as unit data. Unit data is generally encoded and stored as a codeword in the non-volatile memory 2. In the present embodiment, coding is not indispensable. The memory controller 1 may store the unit data in the non-volatile memory 2 without encoding the unit data, but a configuration for performing encoding as one configuration example is shown in FIG. 1. In the case where the memory controller 1 does not perform encoding, the page data coincides with the unit data. Also, one codeword may be generated based on one unit data, or one codeword may be generated based on divided data into which unit data is divided. Furthermore, one codeword may be generated by using plural unit data.

The processor 12 determines a memory area of the non-volatile memory 2 at a destination for writing each unit data. A physical address is allocated to the memory area of the non-volatile memory 2. The processor 12 manages the write destination in the memory area based on the physical address. The processor 12 designates the determined memory area (physical address) and instructs the memory interface 15 to write user data into the non-volatile memory 2. The processor 12 manages the association between the logical address of the user data (logical address managed by the host) and the physical address. When receiving a read request containing a logical address from the host, the processor 12 specifies the physical address corresponding to the logical address, designates the physical address, and instructs the memory interface 15 to read the user data.

The ECC circuit 14 encodes the user data stored in the RAM 11 to generate a codeword. Furthermore, the ECC circuit 14 decodes a codeword read out from the non-volatile memory 2.

The RAM 11 temporarily stores the user data received from the host until the RAM 11 stores the user data into the non-volatile memory 2 or temporarily stores the data read out from the non-volatile memory 2 until the RAM 11 transmits the read data to the host. The RAM 11 is, for example, a general-purpose memory such as an SRAM (static random access memory) or a DRAM (dynamic random access memory).

FIG. 1 shows the configuration example in which the memory controller 1 includes the ECC circuit 14 and the memory interface 15. However, the ECC circuit 14 may be incorporated in the memory interface 15. Furthermore, the ECC circuit 14 may be incorporated in the non-volatile memory 2.

When receiving a write request from the host, the memory system operates as follows. The processor 12 temporarily stores data as a write target in the RAM 11. The processor 12 reads out the data stored in the RAM 11 and inputs the data to the ECC circuit 14. The ECC circuit 14 encodes the input data and inputs the codeword to the memory interface 15. The memory interface 15 writes the input codeword into the non-volatile memory 2.

When receiving a read request from the host, the memory system operates as follows. The memory interface 15 inputs the codeword read out from the non-volatile memory 2 into the ECC circuit 14. The ECC circuit 14 decodes the input codeword and stores the decoded data into the RAM 11. The processor 12 transmits the data stored in the RAM 11 to the host via the host interface 13.

(1-2. Configuration of Non-Volatile Memory)

Figure 2:
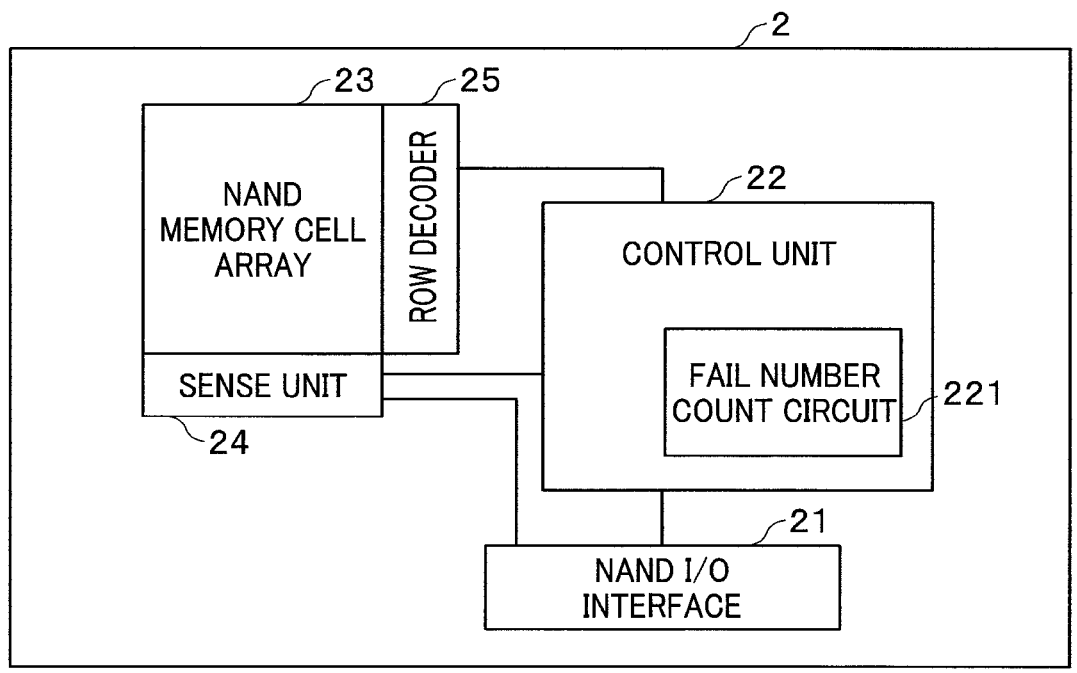
FIG. 2 is a block diagram showing a configuration example of a non-volatile memory according to the embodiment of the present invention.

FIG. 2 is a block diagram showing a configuration example of the non-volatile memory according to the present embodiment. The non-volatile memory 2 includes a NAND I/O interface 21, a control unit 22, a NAND memory cell array (memory cell unit) 23, a sense unit 24, and a row decoder 25. The non-volatile memory 2 includes, for example, a semiconductor substrate of one chip (for example, a silicon substrate).

The control unit 22 controls the operation of the non-volatile-memory 2 based on a command or the like input from the memory controller 1 via the NAND I/O interface 21. More specifically, when a write request is input, the control unit 22 controls the row decoder 25 and the sense unit 24 so as to write data as a write target at a designated address on the NAND memory cell array 23. Furthermore, when a read request is input, the control unit 22 controls to read out the read data from the NAND memory cell array 23 and output the read-out data to the memory controller 1 via the NAND I/O interface 21.

Based on the row address input from the control unit 22, the row decoder 25 selects the NAND memory cell array 23 on a block basis, and applies a desired voltage to the word lines.

The sense unit 24 detects data read out from the NAND memory cell array 23 at the read operation. Furthermore, the sense unit 24 temporarily stores the data input from the memory controller 1 and to be written into the NAND memory cell array 23 at the write operation.

(1-3. Configuration of Memory Cell Array)

Figure 3:
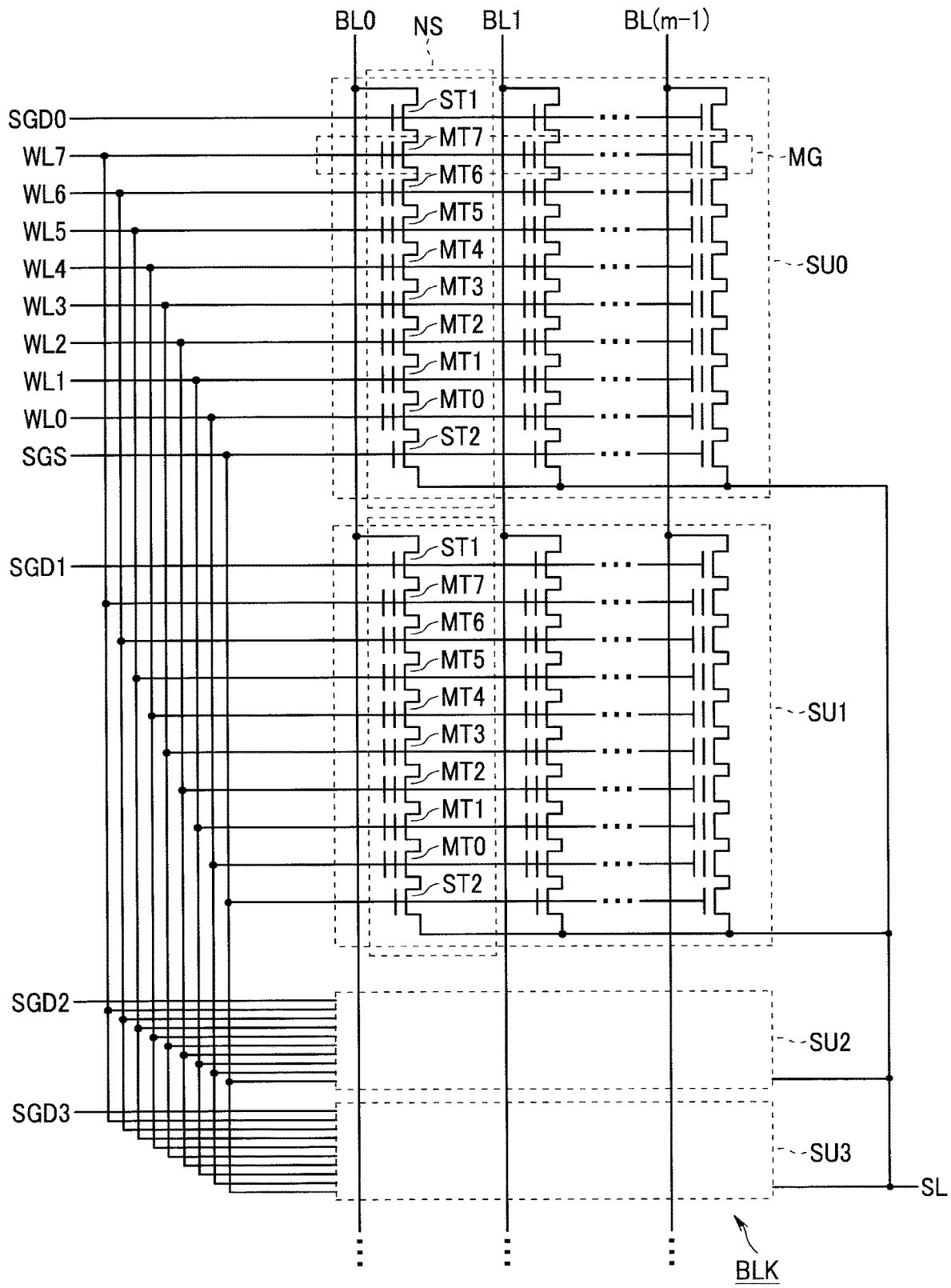
FIG. 3 is a diagram showing a configuration example of a block of a memory cell array having a three-dimensional structure.

FIG. 3 is a diagram showing a configuration example of a block of a memory cell array having a three-dimensional structure. FIG. 3 shows one block BLK out of plural blocks constituting the memory cell array having the three-dimensional structure. The other blocks of the memory cell array have the same configuration as the configuration shown in FIG. 3. Note that the present embodiment can also be applied to a memory cell having a two-dimensional structure.

As shown in FIG. 3, the block BLK includes, for example, four string units SU (SU0 to SU3). Each string unit SU includes plural NAND strings NS. Each of the NAND strings NS includes, for example, eight memory cell transistors MT (MT0 to MT7), and selection transistors ST1 and ST2.

The number of memory cell transistors MT is not limited to eight, and may be, for example, 32, 48, 64, or 96. Although the selection transistors ST1 and ST2 are shown as single transistors on an electric circuit, but the selection transistors ST1 and ST2 may be structurally the same as the memory cell transistors. Furthermore, for example, in order to enhance the cutoff characteristic, plural selection transistors may be used as each of the selection transistors ST1 and ST2. Furthermore, a dummy cell transistor may be provided between the memory cell transistor MT and the selection transistor ST1, ST2.

The memory cell transistors MT are arranged so as to be connected to one another in series between the selection transistors ST1 and ST2. The memory cell transistor MT7 on one end side is connected to the selection transistor ST1, and the memory cell transistor MT0 on the other end side is connected to the selection transistor ST2.

The gates of the selection transistors ST1 of the string units SU0 to SU3 are commonly connected to select gate lines SGD0 to SGD3, respectively. On the other hand, the gates of the selection transistors ST2 are commonly connected to the same select gate line SGS among plural string units SU in the same block BLK. Gates of the memory cell transistors MT0 to MT7 in the same block BLK are commonly connected to word lines WL0 to WL7, respectively. That is, the word lines WL0 to WL7 and the select gate line SGS are commonly connected among the plural string units SU0 to SU3 in the same block BLK. However, the select gate lines SGD are independent of one another among the string units SU0 to SU3 even in the same block BLK.

The word lines WL0 to WL7 are connected to the gate electrodes of the memory cell transistors MT0 to MT7 constituting the NAND string NS, and the memory cell transistors MTi (i=0 to n) in the respective NAND strings NS are commonly connected to one another by the same word line WLi (i=0 to n). That is, the gate electrodes of the memory cell transistors MTi on the same row within the block BLK are connected to the same word line WLi. In the following description, the NAND string NS may be simply referred to as a "string".

The NAND string NS is connected to bit lines, and each memory cell included in the NAND string NS is connected to the corresponding word line WLi. As described above, the data of the memory cells (memory cell transistors MT) in the same block BLK are erased collectively. On the other hand, reading and writing of data are performed on a memory-cell-group MG basis (or page by page). In this specification, plural memory cells which are connected to one word line WLi and belong to one string unit SU are defined as a memory cell group MG. In the present embodiment, the non-volatile memory 2 is a NAND memory of 3-bit/Cell, and one memory cell group MG can hold data of three pages. The 3 bits of each memory cell correspond to these 3 pages, respectively. In the present embodiment, these 3 pages are referred to as a Lower page (first page), a Middle page (second page), and an Upper page (third page), respectively.

In the read operation and the write operation, one word line WLi and one select gate line SGD are selected according to a physical address, and a memory cell group MG is selected.

Figure 4:
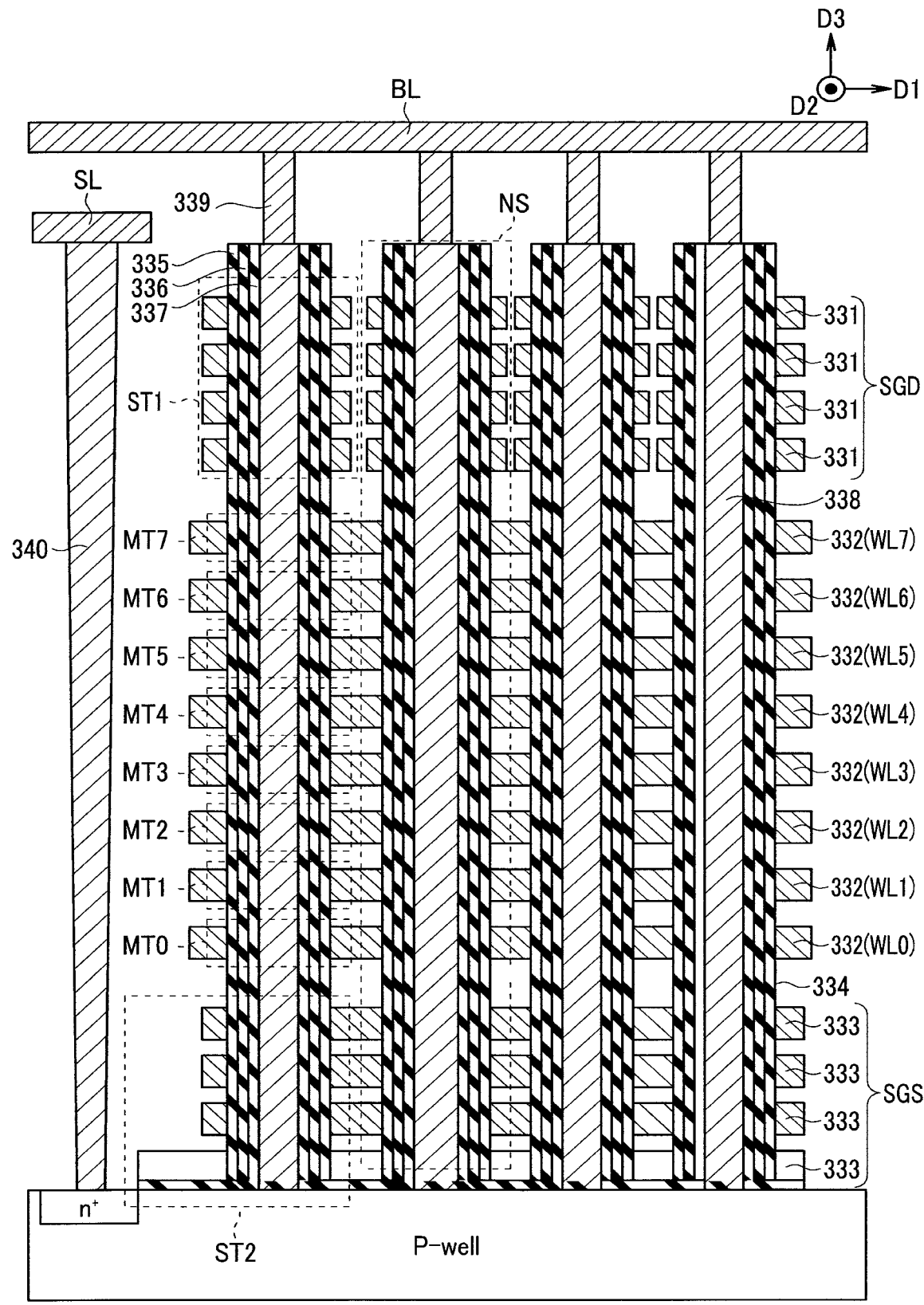
FIG. 4 is a cross-sectional view of a partial region of a memory cell array of a NAND memory having a three-dimensional structure.

FIG. 4 is a cross-sectional view showing a partial area of the memory cell array of the NAND memory having the three-dimensional structure. As shown in FIG. 4, plural NAND strings NS are formed on a p-type well region (P-well). That is, plural wiring layers 333 functioning as the select gate lines SGS, plural wiring layers 332 functioning as the word lines WLi, and plural wiring layers 331 functioning as the select gate lines SGD are stacked on the p-type well region.

A memory hole 334 penetrating through the wiring layers 333, 332, and 331 and reaching the p-type well region is formed. A block insulating film 335, a charge storage layer 336, and a gate insulating film 337 are sequentially formed on the side surface of the memory hole 334, and also a conductor pillar 338 is buried in the memory hole 334. The conductor pillar 338 is made of, for example, polysilicon, and functions as a region where a channel is formed during the operation of the memory cell transistors MT and the selection transistors ST1 and ST2 contained in the NAND string NS.

In each NAND string NS, the selection transistor ST2, the plural memory cell transistors MT, and the selection transistor ST1 are formed on a p-type well region. A wiring layer functioning as the bit line BL is formed at the upper side of the conductor pillar 338. A contact plug 339 connecting the conductor pillar 338 and the bit line BL is formed at an upper end of the conductor pillar 338.

Furthermore, an n+-type impurity diffusion layer and a p+-type impurity diffusion layer are formed in the surface of the p-type well region. A contact plug 340 is formed on the n+-type impurity diffusion layer, and a wiring layer functioning as the source line SL is formed on the contact plug 340.

A plurality of the configurations shown in FIG. 4 are arranged in the depth direction of the paper surface of FIG. 4, and one string unit SU is formed by a set of plural NAND strings aligned in a row in the depth direction.

(1-4. Threshold Voltage Distribution of Memory Cell Transistor)

Figures 5, 6:
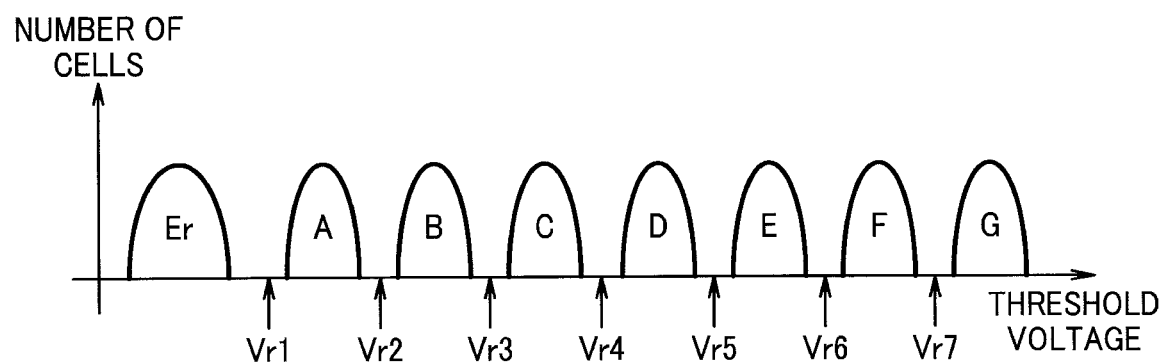
FIG. 5 is a diagram showing an example of a threshold voltage distributions according to the embodiment of the present invention.
FIG. 6 is a diagram showing data coding according to the embodiment of the present invention.

FIG. 5 is a diagram showing an example of a threshold voltage distributions according to the embodiment of the present invention. FIG. 5 shows an example of a threshold voltage distribution of the non-volatile memory 2 of 3-bit/Cell. In the non-volatile memory 2, information is stored with the amount of charges stored in the charge storage layer of the memory cell. Each memory cell has a threshold voltage corresponding to the amount of charges. Plural data values stored in the memory cells are associated with plural regions of the threshold voltages, respectively.

Eight distributions (mountain-shaped) indicated by Er, A, B, C, D, E, F, and G in FIG. 5 represent respective eight threshold voltage distributions. In this manner, each memory cell has threshold voltage distributions partitioned by seven boundaries. In FIG. 5, the horizontal axis represents the threshold voltage, and the vertical axis represents the distribution of the number of memory cells (number of cells).

In the present embodiment, a region where the threshold voltage is not more than Vr1 is referred to as a region Er, a region where the threshold voltage is larger than Vr1 and not more than Vr2 is referred to as region A, a region where the threshold voltage is larger than Vr2 and not more than Vr3 is referred to as a region B, and a region where the threshold voltage is larger than Vr3 and not more than Vr4 is referred to as a region C. Furthermore, in the present embodiment, a region where the threshold voltage is larger than Vr4 and not more than Vr5 is referred to as a region D, and a region where the threshold voltage is larger than Vr5 and not more than Vr6 is referred to as region E, a region where the threshold voltage is larger than Vr6 and not more than Vr7 is referred to as region F, and a region where the threshold voltage is larger than Vr7 is referred to as region G.

Furthermore, the threshold voltage distributions corresponding to the regions Er, A, B, C, D, E, F, and G are referred to as distributions Er, A, B, C, D, E, F and G (first to eighth distributions), respectively. Vr1 to Vr7 are threshold voltages serving as the boundaries of the respective regions.

In the non-volatile memory 2, plural data values are associated with the plural threshold voltage distributions of the memory cell, respectively. This association is called as data coding. The data coding is set in advance, and when writing (programming) data, charges are injected into the memory cell so that the memory cell has a threshold voltage set within a region corresponding to a data value to be stored according to the data coding. When reading data, a read voltage is applied to the memory cell, and data is determined according to whether the threshold voltage of the memory cell is lower or higher than the read voltage.

FIG. 6 is a diagram showing the data coding according to the first embodiment. In the present embodiment, the eight threshold voltage distributions shown in FIG. 5 are associated with eight threshold voltage distributions each including 3 bits, respectively. The relationship between the threshold voltage and the data value of the bits corresponding to the Upper, Middle, and Lower pages is as follows.

A memory cell having a threshold voltage within the region Er is in a state where "111" is stored.

A memory cell having a threshold voltage within the region A is in a state where "101" is stored.

A memory cell having a threshold voltage within the region B is in a state where "001" is stored.

A memory cell having a threshold voltage within the region C is in a state where "011" is stored.

A memory cell having a threshold voltage within the region D is in a state where "010" is stored.

A memory cell having a threshold voltage within the region E is in a state where "110" is stored.

A memory cell having a threshold voltage within the F region is in a state where "100" is stored.

A memory cell having a threshold voltage within the G region is in a state where "000" is stored.

In this way, the state of 3-bit data of each memory cell can be represented for each threshold voltage region. Note that when a memory cell is not written (a state of "erased"), the threshold voltage of the memory cell is in the Er region. Furthermore, with respect to the symbols shown here, the data of only 1 bit is changed between any two adjacent states like the data of "111" is stored in the Er (erased) state and the data of "101" is stored in the A state. In this way, the coding shown in FIG. 6 is a gray code in which data of only 1 bit is changed between any two adjacent regions.

In FIG. 5, a case where the eight levels are discretely distributed has been described as an example. However, this state is an ideal state immediately after the write operation, for example. Therefore, realistically, adjacent levels may overlap each other. For example, after the time elapses after the write operation, the upper end of the distribution Er and the lower end of the distribution A may overlap each other due to disturbance or the like. In such a case, data are corrected by using an ECC technique, for example.

(2. Operation)

Next, a data write operation in the present embodiment will be described.

(2-1. Concept of Write Operation)

First, the write operation according to the present embodiment will be briefly described. First, the write operation roughly includes a program operation and a verify operation.

The program operation is an operation of increasing the threshold voltage by injecting electrons into the charge storage layer (or maintaining the threshold voltage by prohibiting injection). Hereinafter, the operation of increasing the threshold voltage is referred to as "0" program or "0" writing, and "0" data is given to a bit line BL targeted for the "0" program. On the other hand, the operation of maintaining the threshold voltage is referred to as "1" program, "1" writing or "write inhibition", and "1" data is given to a bit line BL targeted for the "1" program.

The verify operation is an operation of reading data after the program operation to determine whether the threshold voltage of the memory cell transistor MT has reached a target level. The memory cell transistor MT having reached the target level is afterwards inhibited from being written.

By repeating the combination of the program operation and the verify operation described above, the threshold voltage of the memory cell transistor MT is increased to the target level.

Figure 7:
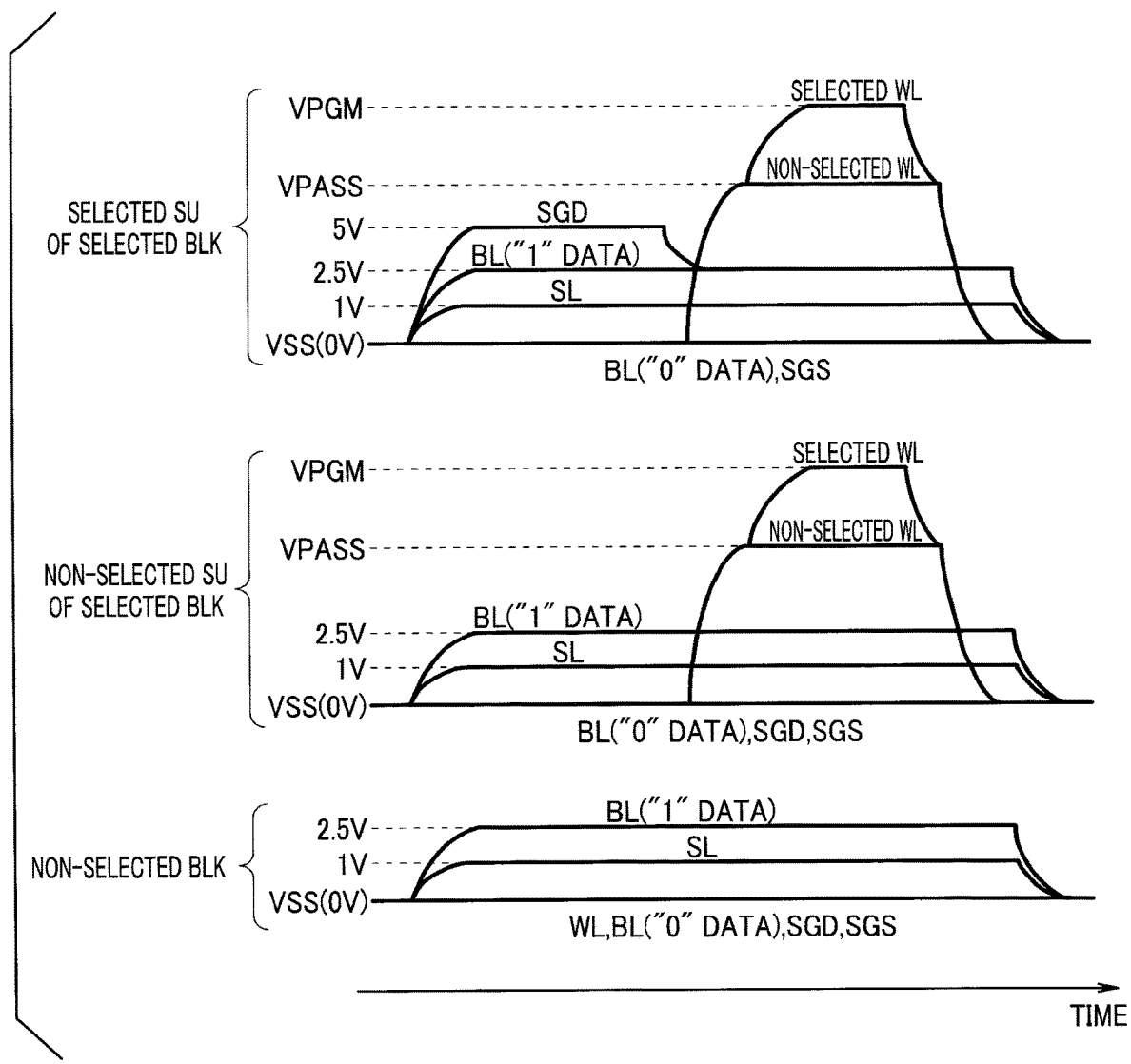
FIG. 7 is a diagram showing a potential variation of each wiring during a write operation.

FIG. 7 shows the potential change of each wiring during the program operation. As shown in FIG. 7, the sense unit 24 first transfers program data to each bit line BL. A ground voltage Vss as "L" level (for example, 0 V) is applied to the bit line BL to which "0" data is given. "H" level, for example, 2.5 V is applied to the bit line BL to which "1" data is given.

The row decoder 25 selects any block BLK and further selects any string units SU. Then, for example, 5 V is applied to the select gate line SGD in the selected string unit SU to turn on the selection transistor ST1. On the other hand, the voltage Vss is applied to the select gate line SGS to turn off the selection transistor ST2.

Furthermore, the row decoder 25 applies the voltage Vss to the select gate lines SGD and SGS of non-selected string units SU in a selected block BLK and non-selected string units SU in a non-selected block unit BLK to turn off the selection transistors ST1 and ST2.

The source line SL is set to, for example, 1 V (a potential higher than the potential of the select gate line SGS).

Thereafter, the row decoder 25 sets the potential of the select gate line SGD of the selected string unit SU in the selected block BLK to, for example, 2.5 V. This potential is a voltage for turning on the selection transistor ST1 corresponding to the bit line BL to which "0" data (0 V) is given, but cutting off the selection transistor ST1 corresponding to the bit line BL to which "1" data (2.5 V) is given.

Then, the row decoder 25 selects any word line WL in the selected block BLK, applies the voltage VPGM to the selected word line, and applies the voltage VPASS to the other non-selected word lines WL. The voltage VPGM is a high voltage for injecting electrons into the charge storage layer by a tunnel phenomenon, and VPGM>VPASS is satisfied. The state of the string unit SU at this time is shown in FIG. 8.

Figure 8:
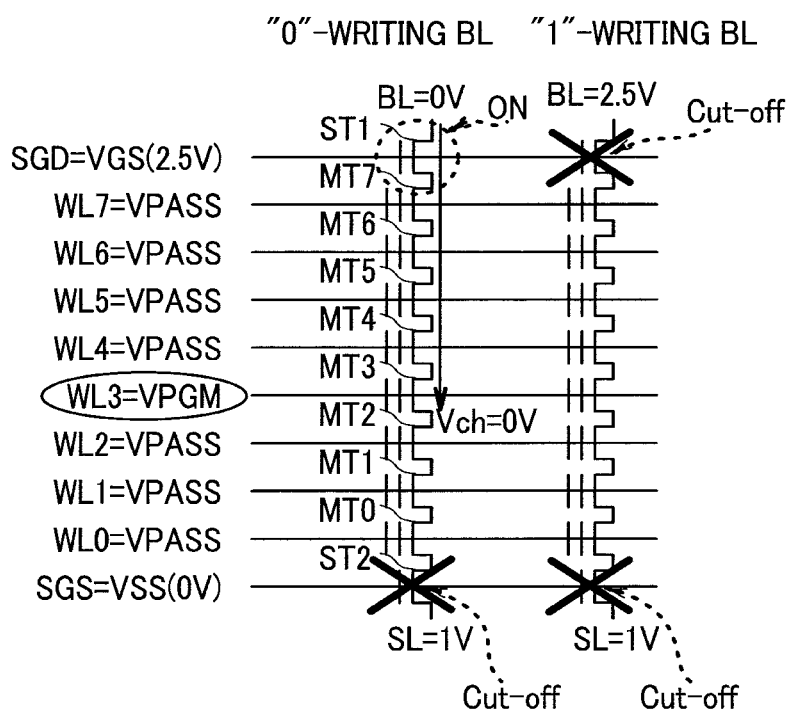
FIG. 8 is a circuit diagram showing a state of a string during the write operation.

FIG. 8 shows two NAND strings corresponding to a bit line BL as a "0"-write target and a bit line BL as a "1"-write target. In addition, FIG. 8 shows a state when the word line WL3 is selected.

As shown in FIG. 8, the voltage VPGM is applied to the selected word line WL 3, and the voltage VPASS is applied to the non-selected word lines WL0 to WL2 and WL4 to WL7.

In the NAND string corresponding to the bit line BL as the "0"-write target, the selection transistor ST1 is turned on. Therefore, the channel potential Vch of the memory cell transistor MT3 connected to the selected word line WL3 is equal to 0 V. That is, the potential difference between the gate and the channel becomes large, so that electrons are injected into the charge storage layer, and the threshold voltage of the memory cell transistor MT3 is increased.

In the NAND string corresponding to the bit line BL as the "1"-write target, the selection transistor ST1 falls into a cutoff state. Therefore, the channel of the memory cell transistor MT3 connected to the selected word line WL3 is electrically floated, and the channel potential Vch is increased to be near the voltage VPGM due to capacitive coupling with the word line WL or the like. That is, the potential difference between the gate and the channel becomes small, so that electrons are not injected into the charge storage layer and the threshold voltage of the memory cell transistor MT3 is maintained (the threshold voltage does not vary to the extent that the threshold voltage distribution level transits to a higher distribution)

(2-2. Specific Example of Write Operation)

In description on the write operation of the present embodiment, a standard write sequence will be first described in more specifically with reference to FIGS. 9 and 10. FIGS. 9 and 10 show an example in which data are written by repeating the combination of the program operation and the verify operation at 19 times. This repeating operation is called a "loop".

FIG. 9 shows the target level of the verify operation performed in each loop. As shown in FIG. 9, in first and second loops, only the verify operation for the "A" level is performed. That is, a voltage VfyA is applied to the selected word line WL during the verify operation, and voltages VfyB to VfyG are not applied. In subsequent third and fourth loops, the verify operation for the "A" level and the verify operation for the "B" level are performed. That is, during the verify operation, the voltages VfyA and VfyB are sequentially applied to the selected word line WL, and the voltages VfyC to VfyG are not applied.

In fifth and sixth loops, the verify operation for the "A" level, the verify operation for the "B" level and the verify operation for the "C" level are performed. That is, during the verify operation, the voltages VfyA, VfyB, and VfyC are sequentially applied to the selected word line WL, and the voltages VfyD to VfyG are not applied. The verify operation for the "A" level is completed in the sixth loop. This is because it is empirically found that the program to the "A" level is almost completed with a loop number of six loops, for example.

In seventh and eighth loops, the verify operation for the "B" level, the verify operation for the "C" level and the verify operation for the "D" level are performed. That is, during the verify operation, the voltages VfyB, VfyC, and VfyD are sequentially applied to the selected word line WL. The verify operation for the "B" level is completed by an eighth write operation. Furthermore, in ninth and tenth loops, the verify operation for the "C" level, the verify operation for the "D" level and the verify operation for the "E" level are performed. That is, the voltages VfyC, VfyD, and VfyE are sequentially applied to the selected word line WL during the verify operation. The verify operation for the "C" level is completed in a tenth loop.

Thereafter, the write operation up to the G level is likewise performed and the loop is repeated up to 19 times at maximum.

FIG. 10 corresponds to FIG. 9, and shows the state of the bit line corresponding to the target level of the threshold voltage in each loop. In FIG. 10, the notation of "1" means that the "1" data is given to the corresponding bit line BL, and the notation "0" means that "0" data is given.

As shown in FIG. 10, when the threshold voltage of the memory cell transistor MT should be kept at the "Er" level, the "1" data is given to the bit line BL over all the loops, that is, during the write operation, the selection transistor ST1 is set to the cutoff state at all times.

When the target level of the threshold voltage is the "A" level, that is, for a memory cell transistor MT for which the threshold voltage should be increased from a value within the "Er" level to a value within the "A" level, the "0" program operation may be performed from the first to sixth loops. This corresponds to the loop in which the verify operation for the "A" level is performed. The "0" data is given to the bit line BL until the verify operation is passed, and the "1" data is given after passing. In the seventh and subsequent loops, as the threshold voltage of the corresponding memory cell transistor MT has highly likely reached to the "A" level, the data "1" is given to the bit line BL, and further programming thereto is inhibited.

When the target level is the "B" level, that is, for a memory cell transistor MT in which the threshold voltage should be increased from a value within the "Er" level to a value within the "B" level, the "0" program operation may be performed in the first to eighth loops. This corresponds to a loop in which the verify operation on the "B" level is performed. In the third to eighth loops, the "0" data is given to the bit line BL until the verify operation is passed, and the "1" data is given after the verify operation is passed. In the ninth and subsequent loops, as the threshold voltage of the corresponding memory cell transistor MT has highly likely reached to the "B" level, the "1" data is given to the bit line BL, and further programming thereto is inhibited.

Thereafter, the program operation up to the "C" level to "G" level likewise performed.

Figure 11:
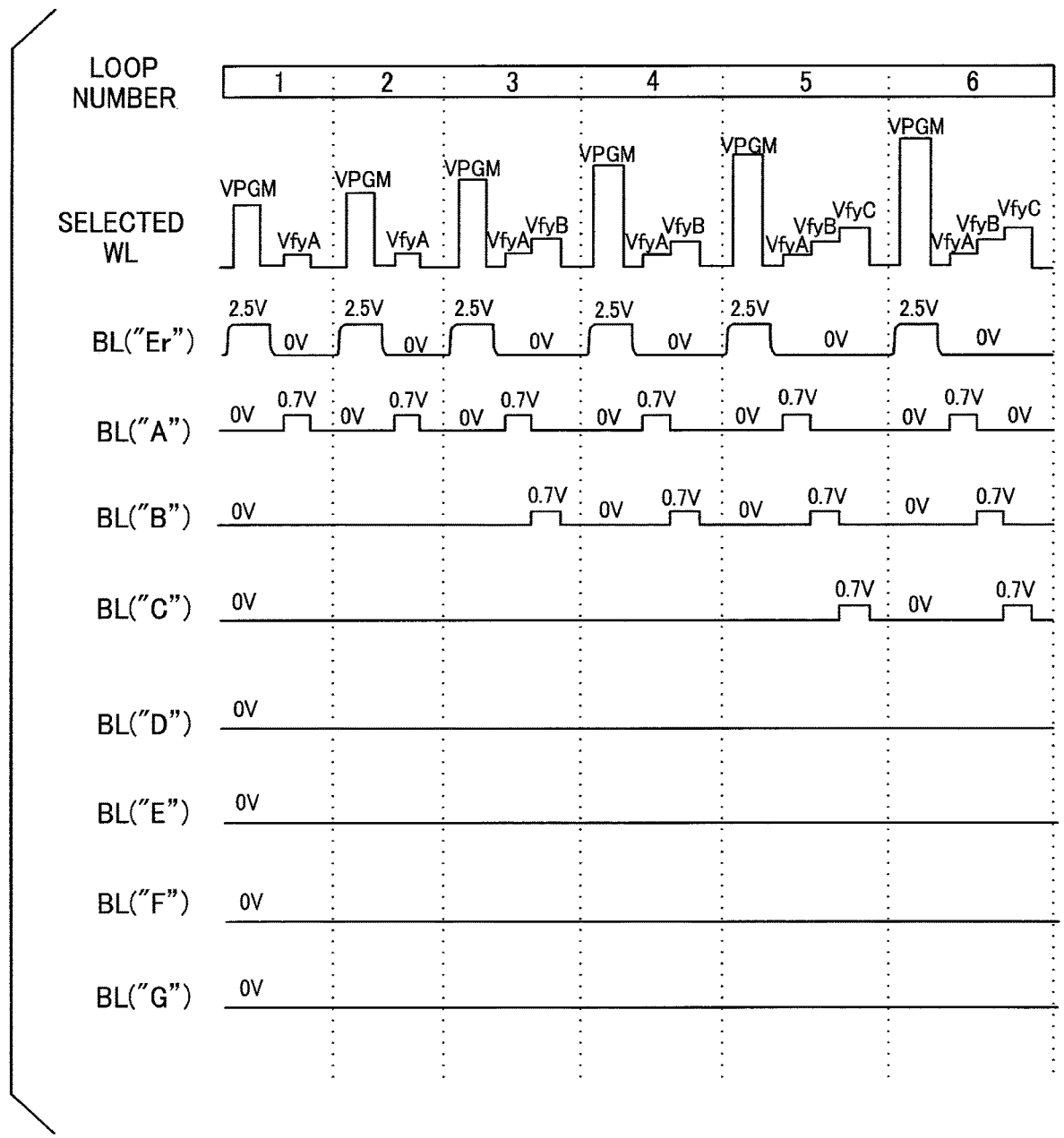
FIG. 11 is a timing chart showing the relationship between a selected word line and the voltages of the bit lines during the write operation based on the standard write sequence.
Figure 12:
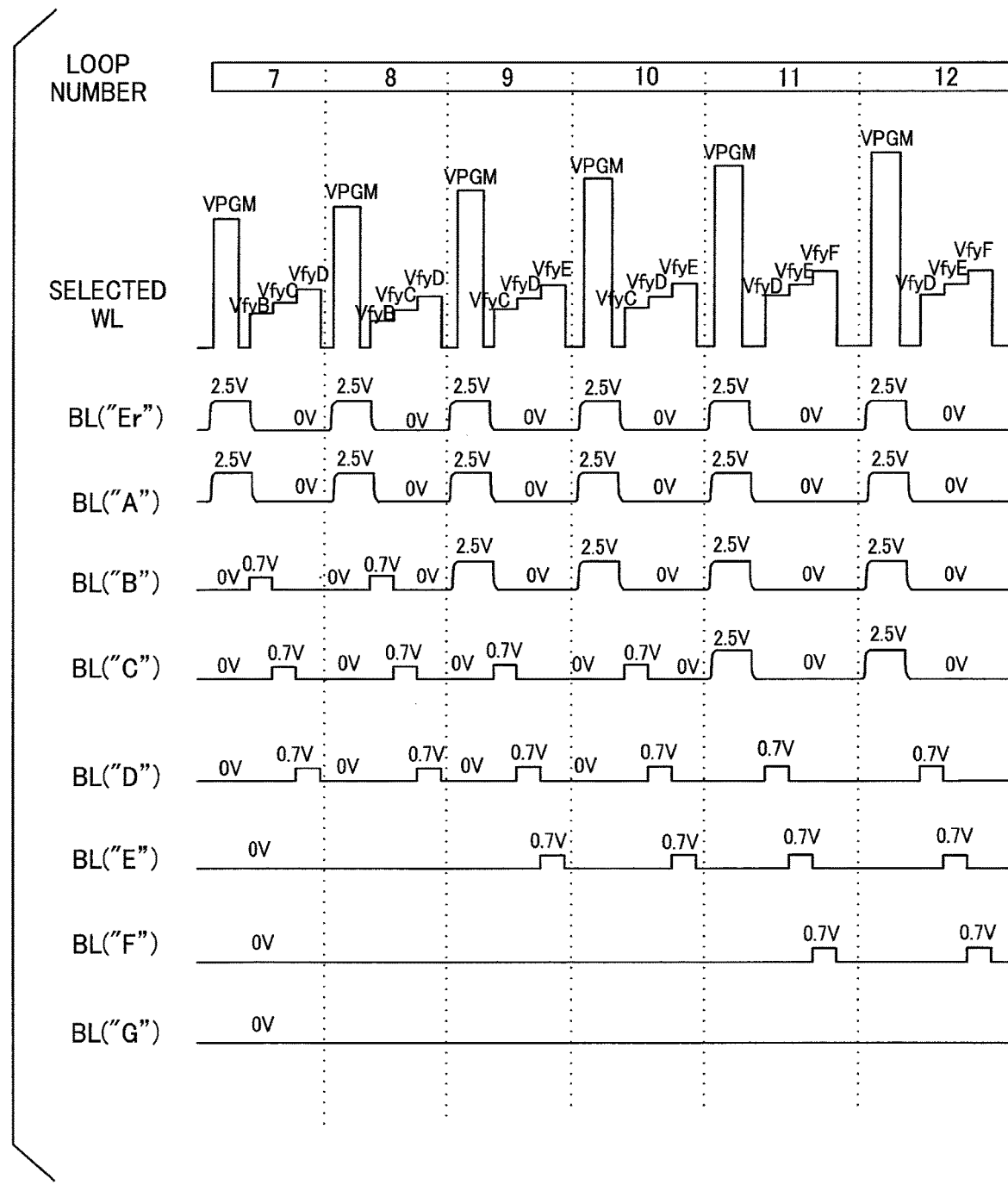
FIG. 12 is a timing chart showing the relationship between the selected word line and the voltages of the bit lines during the write operation based on the standard write sequence.

The state of potential for each wiring during operation time is shown in FIGS. 11 and 12. FIGS. 11 and 12 show time variations of the potential of the selected word line WL, the potential of the bit line BL corresponding to the memory cell transistor MT in which the "Er" level should be maintained (denoted by BL("Er") in FIGS. 11 and 12), and the bit lines BL corresponding to memory cell transistors MT in which the threshold voltages should be increased to values within the "A" level to the "G" level (denoted by BL("A"), BL("B"), BL("C"), BL("D"), BL("E"), BL("F"), and BL("G"), respectively in FIGS. 11 and 12) in the first to twelfth loops.

As shown in FIGS. 11 and 12, in the first loop, the "0" program is performed on the bit lines BL ("A") to BL ("G"). That is, the voltage VPGM is applied to the selected word line WL, for example, 2.5 V is applied to the bit line BL("Er"), and for example, the voltage VSS(=0 V) is applied to the bit lines BL("A") to BL("G"). Then, the verify operation on the "A" level is performed. That is, the bit line BL("A") is precharged to, for example, 0.7 V, and the verify voltage VfyA is applied to the selected word line WL. The other bit lines BL("Er") and BL("B") to BL("G") are fixed to, for example, 0 V and are excluded from verify targets.

In the second loop, the "0" program is performed on the bit line BL("A") for which the verify operation on the "A" level in the first loop fails, and the bit lines BL("B") to BL("G"). At this time, the voltage VPGM to be applied to the selected word line WL is stepped up. Then, as in the case of the first loop, the verify operation on the "A" level is performed.

In the third loop, as in the case of the second loop, the "0" program is performed on the bit line BL("A") for which the verify operation on the "A" level fails, and the bit lines BL("B") to BL("G"). At this time, the voltage VPGM to be applied to the selected word line WL is stepped up. Then, as in the case of the first and second loops, the verify operation on the "A" level is first performed. Next, the verify operation on the "B" level is performed. That is, the bit lines BL("A") and BL("B") are precharged to, for example, 0.7 V, and the verify voltages VfyA and VfyB are sequentially applied to the selected word line WL. The other bit lines BL("Er") and BL("C") to BL("G") are fixed to, for example, 0 V, and are excluded from verify targets. In the fourth loop, the voltage VPGM is stepped up, and an operation similar to the operation in the third loop is performed.

In the fifth loop, the "0" program is performed on the bit lines BL("A"), BL("B"), and BL("C"). Then, the verify operation for the "A" level, the verify operation for the "B" level and the verify operation for the "C" level are performed. In the sixth loop, the voltage VPGM is stepped up, and an operation similar to the operation in the fifth loop is performed.

Thereafter, the write operation is likewise performed, and all of the bit lines BL("A"), BL("B"), and BL("C") are inhibited from being written in the eleventh loop.

Figure 14:
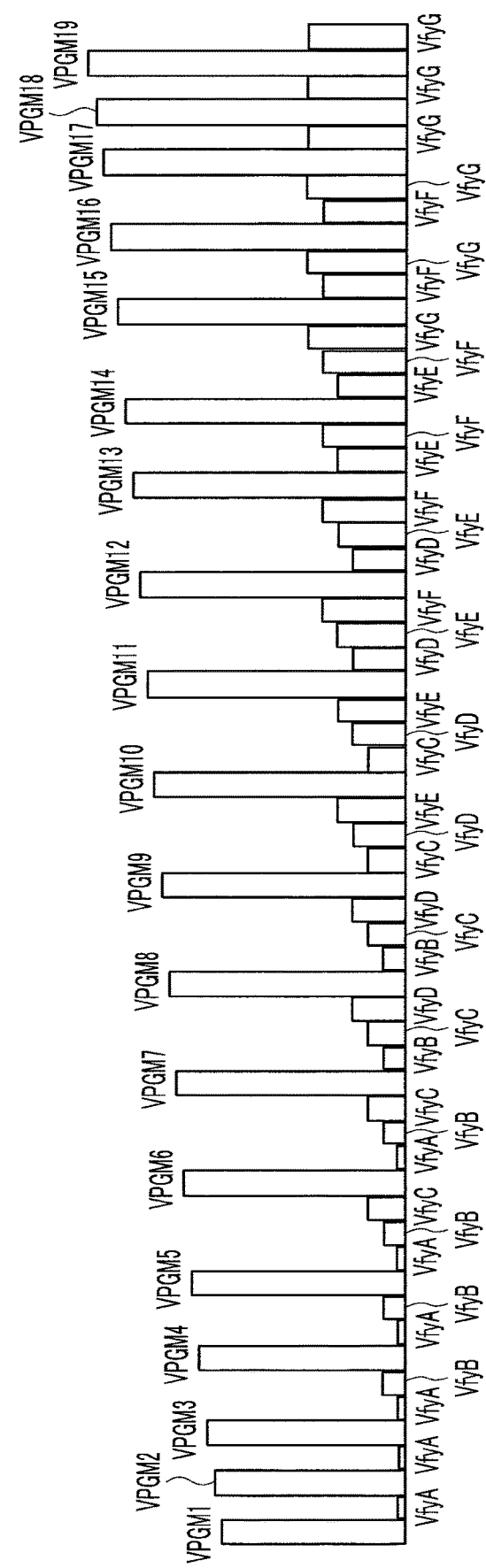
FIG. 14 is a diagram showing the timings of the program operation and the verify operation during the write operation based on the standard write sequence.

FIG. 13 is a diagram showing an example of the voltage (voltage VPGM) of the selected word line in each loop during the write operation based on the above-described standard write sequence. FIG. 14 is a diagram showing the timings of the program operation and the verify operation during the write operation based on the above-described standard write sequence.

As shown in FIG. 13, in the first loop, the voltage VPGM to be applied to the selected word line WL is set to, for example, 12.0 V. In the second and subsequent loops, the voltage VPGM to be applied to the selected word line WL is set so as to increase by 0.5 V at each loop. That is, the voltage VPGM to be applied to the selected word line WL in the second loop is set to 12.5 V, the voltage VPGM to be applied to the selected word line WL in the third loop is set to 13.0 V, and the voltage VPGM to be applied to the selected word line WL in the nineteenth loop which is the last loop is set to 21.0 V.

As shown in FIG. 14, in the first and second loops, only the verify operation for the "A" level is performed. That is, the verify operation is performed once for one program operation. In the third and fourth loops, the verify operation for the "A" level and the verify operation for the "B" level are performed. That is, the verify operation is performed twice for one program operation. In the loops from the fifth loop to the twelfth loop in which the verify operation for the "D" level is completed, the verify operation is performed three times for one program operation. Thereafter, the verify operation for a set predetermined level is performed for one program operation. Eventually, in the nineteen loops, the program operation is performed at 19 times and the verify operation is performed at 42 times.

In the foregoing description, it is assumed that the verify operation is performed up to an upper limit number. As shown in FIG. 9, the verify operation for the "A" level may be performed up to six times at maximum from the first loop to the sixth loop. Also, the verify operation for the "B" level may be performed up to six times at maximum from the third loop to the eighth loop. The same is applied to the other levels. Here, for example, a plurality of memory cell transistors MT to be written with the "A" level exist, and a plurality of bit lines BL("A") connected to the plurality of memory cell transistors MT exist. Accordingly, strictly speaking, for example, when all of the memory cell transistors MT written with the "A" level pass the verify operation for the "A" level in the fifth loop, the verify operation may not be performed with respect to the bit line BL("A") in the sixth loop. This is also applied in the following description.

The voltage VPGM to be applied to the selected word line WL in the first program operation, the increase amount of the voltage VPGM in the second and subsequent program operations, and the loop in which the verify operation in each level starts are set on the assumption of the worst case in which writing progresses fast, and sufficient margin is secured so that excess writing beyond the target threshold voltage levels is not performed.

The loop number in the write operation, the voltage of the selected word line (voltage VPGM) in each loop, and the target levels of the verify operation in each loop are stored as a standard write sequence in the control unit 22. When the write operation to the NAND memory cell array 23 is executed based on the standard write sequence, a control signal based on the standard write sequence is output from the control unit 22 to the sense unit 24 and the row decoder 25.

Figure 15:
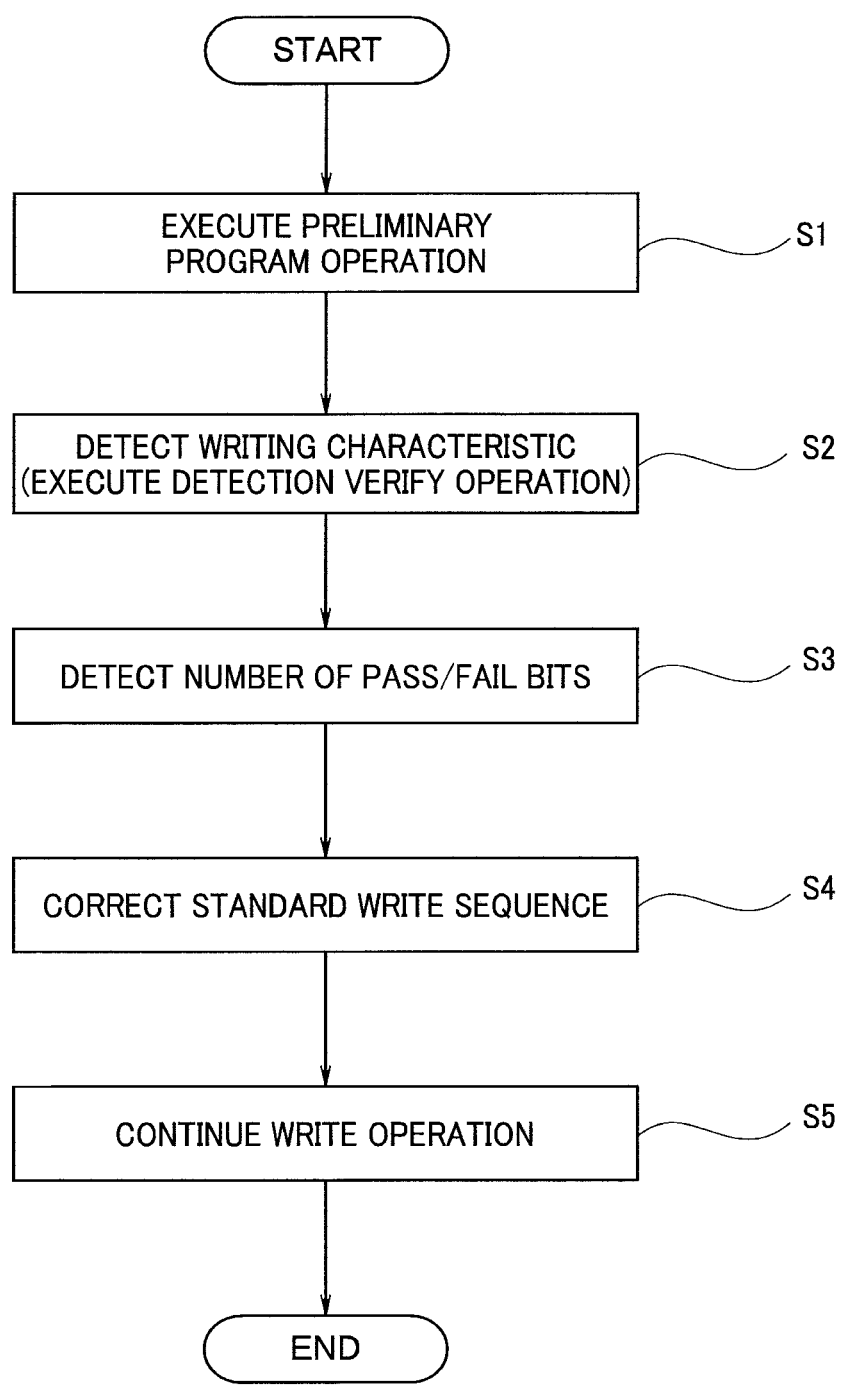
FIG. 15 is a flowchart showing an example of the procedure of the write operation in a first embodiment.

Next, the write operation in the present embodiment will be described with reference to FIG. 15. FIG. 15 is a flowchart showing an example of the procedure of the write operation in the first embodiment.

First, a writing characteristic of the memory cell transistors MT is detected, and the standard write sequence is corrected based on a detection result of the writing characteristic. First, a preliminary program operation is performed on memory cell transistors MT having high target levels as the threshold voltage (Si). In the preliminary program operation in Si, for example, the voltage VPGM of the ninth loop is applied to the selected word line for the memory cell transistors MT having the "E" level to the "G" level as the target level of the threshold voltage. Note that the voltage to be applied in the preliminary program operation is not limited to the voltage VPGM of the ninth loop, but may be the voltage of another loop.

Next, the detection verify operation for the preliminary program operation is performed to detect the writing characteristic (S2). The detection verify operation in S2 is performed with the target level corresponding to the voltage applied in the preliminary program operation of Si. For example, when the voltage VPGM of the ninth loop is applied to the selected word line, the detection verify operation for the "E" level is performed.

Subsequently, the number of bits that have passed the detection verify operation in S2 and the number of bits that have failed the detection verify operation in S2 are detected (S3). The detection of the numbers of the pass/fail bits is performed in a fail number count circuit 221 provided in the control unit 22. When the number of memory cell transistors MT having the "E" level as the target level of the threshold voltage are calculable, the detection of the number of bits in S3 may be performed on only either the pass bits or the fail bits.

Next, the control unit 22 estimates the writing characteristic of the memory cell transistors MT based on the number of pass/fail bits detected in S3, and corrects the standard write sequence (S4). For example, in S3, when the rate of the fail bits (the rate of the fail bits to the total number of memory cell transistors MT having the "E" level as the target level of the threshold voltage) is larger than a preset threshold voltage, it is estimated that the writing characteristic is slow. The other memory cell transistors MT belonging to the same memory cell group MG (which does not have the "E" level as the target level of the threshold voltage) are also estimated to have a slow writing characteristic.

Here, as described above, the voltage VPGM to be applied to the selected word line WL in the first program operation, the increase amounts of the voltage VPGM in the second and subsequent program operations, and the loop in which the verify operation in each level starts are set on the assumption of a worst case in which writing progresses fast. Therefore, it is not efficient to apply such parameters even when it is estimated that the writing characteristic is slow.

Therefore, the standard write sequence is corrected so that the first loop of the standard write sequence is skipped and the program operation is performed from the second loop, for example. Furthermore, the standard write sequence is corrected so that the verify operation for each level is started at a timing which is later from the standard write sequence by one loop. Note that the correction of the standard write sequence may be performed by not only skipping of the loop and setting the loop later in which the verify operation is started, but also increasing or decreasing the voltage VPGM in each loop or increasing or decreasing the step-up width of the voltage VPGM between the loops.

FIG. 16 shows the target levels of the verify operation performed in each loop of the corrected write sequence. The horizontal axis of FIG. 16 represents the loop number in the standard write sequence. In FIG. 16, the verify operation of each level is executed in loops marked with "○". With respect to loops marked with "-", the verify operation is set in the standard write sequence, but the verify operation is skipped (not executed) due to the correction.

As shown in FIG. 16, in the first loop of the standard write sequence, the verify operation for the "A" level is performed, but the verify operation is not performed in the corrected write sequence. In the third loop of the standard write sequence, the verify operation for the "A" level and the verify operation for the "B" level are performed. However, in the corrected write sequence, only the verify operation for the "A" level is performed, and the verify operation is not performed with respect to the "B" level. In the fifth loop of the standard write sequence, in the corrected write sequence, the verify operation for the "A" level and the verify operation for the "B" level are performed, and the verify operation for the "C" level is skipped.

Thereafter, in the seventh, eleventh, and fourteenth loops of the standard write sequence, the verify operation for the highest levels set in the above loops (the verify operation for the "D" level, the "E" level, F "level", respectively) are likewise skipped, and the number of verify operations is reduced.

FIG. 17 shows an example of the voltage (voltage VPGM) of the selected word line in each loop during the write operation of the semiconductor memory device of the first embodiment. The horizontal axis of FIG. 17 represents the loop number in the standard write sequence.

First, in the preliminary program operation, the voltage VPGM applied to the selected word line WL is set to, for example, the voltage VPGM (16.0 V) of the ninth loop in the standard write sequence. The program operation of the first loop in the standard write sequence is not performed in the corrected write sequence, and the program operation is started from the second loop. The voltage VPGM applied to the selected word line WL in the second loop of the standard write sequence is 12.5 V, but it is increased/decreased by ±α by the correction (α≥0). Thereafter, the voltage VPGM to be applied to the word line WL is increased or decreased by ±α (α≥0) by the correction from the third loop of the standard write sequence to the nineteenth loop which is the last loop.

Figure 18:
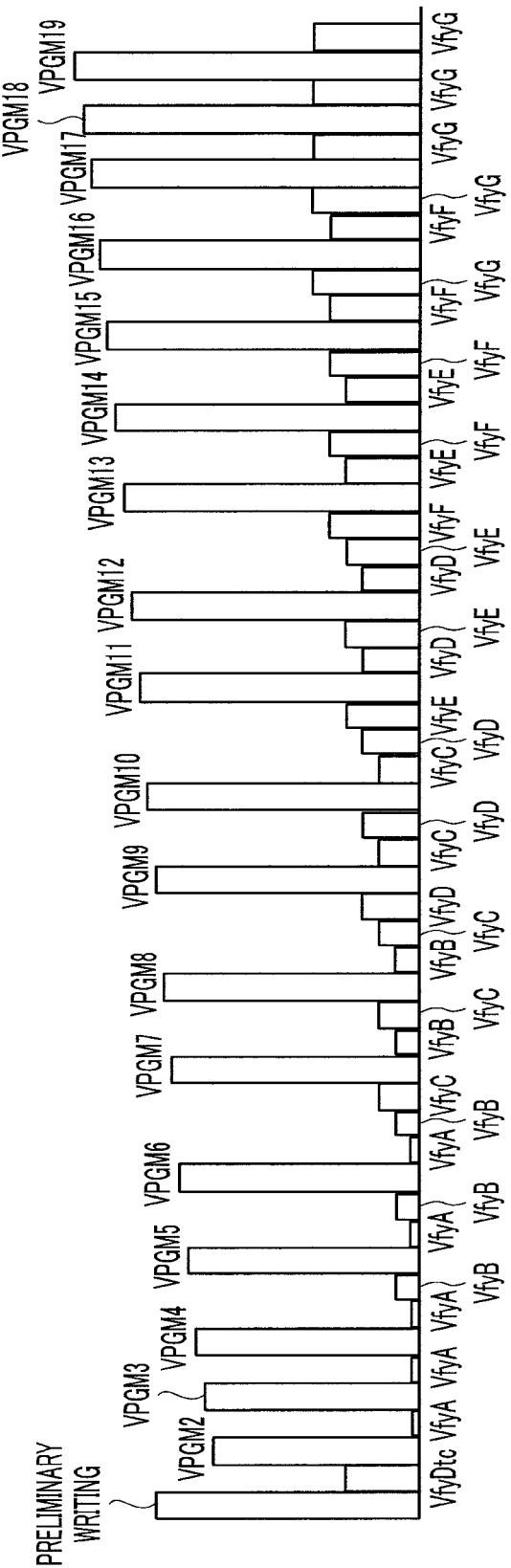
FIG. 18 is a diagram showing an example of the timings of the program operation and the verify operation during the wiring operation of the semiconductor memory device in the first embodiment.

FIG. 18 shows the timings of the program operation and the verify operation during the above-described write operation. First, prior to the standard write sequence, a preliminary program operation and a detection verify operation for the above preliminary program operation are performed. As a result, the standard write sequence is corrected, and executed from the second loop of the standard write sequence. In the second and third loops of the standard write sequence, only the verify operation for the "A" level is performed. That is, the verify operation is performed once for one program operation. In the fourth and fifth loops of the standard write sequence, the verify operation for the "A" level and the verify operation for the "B" level are performed. That is, the verify operation is performed twice for one program operation. In the sixth loop of the standard write sequence, the verify operation for the "A" level and the verify operation for the "C" level are performed. That is, the verify operation is performed three times for one program operation.

Thereafter, the verify operation for a set predetermined level is performed for one program operation. Eventually, in eighteen loops, the program operation is performed at 18 times and the verify operation is performed at 5 times for each level (totally, 35 times). That is, the program operation is performed at 19 times and the verify operation is performed at 36 times even when the preliminary program operation and the detection verify operation for the preliminary program operation are contained.

Finally, the control unit 22 outputs a control signal based on the corrected write sequence to the sense unit 24 and the row decoder 25 as described above, and the write operation on the NAND memory cell array 23 is continued (S5).

In the foregoing description, a case where the correction is made so that the first loop of the standard write sequence is skipped and the program operation is executed from the second loop has been described. However, two or more loops may be skipped according to the writing characteristic of the memory cell transistors MT. An example of the correction when the writing characteristic is further slow and the first and second loops of the standard write sequence are skipped will be described with reference to FIGS. 19 to 21.

FIG. 19 shows the target level of the verify operation performed in each loop of the corrected write sequence. In FIG. 19, the verify operation for each level is executed in the loops marked with "○". With respect to loops marked with "-", the verify operation is set in the standard write sequence, but the verify operation is skipped (not executed) due to the correction.

As shown in FIG. 19, in the first and second loops of the standard write sequence, the verify operation for the "A" level is performed, but the verify operation is not performed in the corrected write sequence. In the third and fourth loops of the standard write sequence, the verify operation for the "A" level and the verify operation for the "B" level are performed. However, in the corrected write sequence, only the verify operation for the "A" level is performed, and the verify operation for the "B" level is not performed. Furthermore, in the fifth and sixth loops of the standard write sequence, the verify operation for the "A" level and the verify operation for the "B" level are performed in the corrected write sequence, and the verify operation for the "C" level is skipped.

Thereafter, in the seventh to twelfth loops, the fourteenth loop, and the fifteenth loop in the standard write sequence, the verify operation for the highest level set in the loop is likewise skipped, so that the number of the verify operation is reduced.

FIG. 20 shows an example of the voltage (voltage VPGM) of the selected word line in each loop during the write operation of the semiconductor memory device described above. The horizontal axis of FIG. 20 shows the loop number in the standard write sequence.

First, in the preliminary program operation, the voltage VPGM to be applied to the selected word line WL is set to, for example, the voltage VPGM (16.0 V) of the ninth loop in the standard write sequence. The program operation of the first loop and the second loop in the standard write sequence is not performed in the corrected write sequence, and the program operation is started from the third loop. The voltage VPGM to be applied to the selected word line WL in the third loop of the standard write sequence is equal to 13.0 V, but the voltage VPGM is increased/decreased by ±α (α≥0) through the correction. Thereafter, the voltage VPGM to be applied to the word line WL is increased/decreased by ±α (α≥0) from the fourth loop to the nineteenth loop as the final loop in the standard write sequence through the correction.

Figure 21:
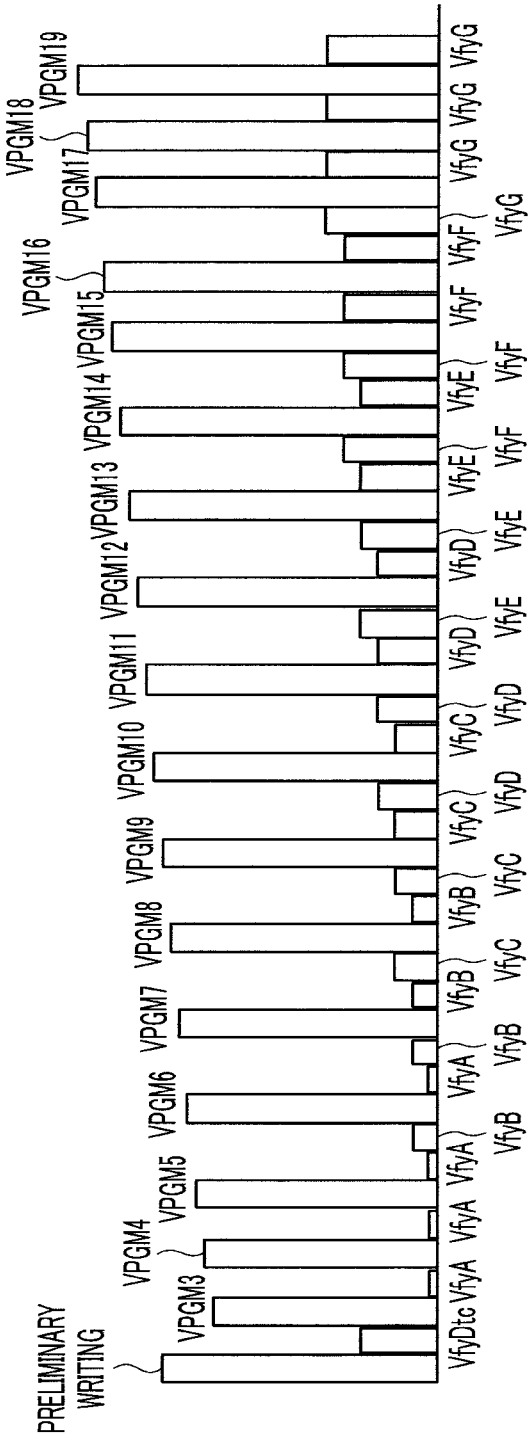
FIG. 21 is a diagram showing another example of the timings of the program operation and the verify operation during the write operation of the semiconductor memory device in the first embodiment.

FIG. 21 shows the timings of the program operation and the verify operation in the above-described write operation. First, prior to the standard write sequence, the preliminary program operation and the detection verify operation for this preliminary program operation is performed. As a result, the standard write sequence is corrected and executed from the third loop in the standard write sequence. In the third and fourth loops of the standard write sequence, only the verify operation for the "A" level is performed. That is, the verify operation is performed once for one program operation. In the fifth and sixth loops of the standard write sequence, the verify operation for the "A" level and the verify operation for the "B" level are performed. That is, the verify operation is performed twice for one program operation. In the seventh loop of the standard write sequence, the verify operation for the "B" level and the verify operation for the "C" level are performed. That is, the verify operation is performed twice for one program operation.

Thereafter, the verify operation for a set predetermined level is performed for one program operation. Eventually, in the seventeen loops, the program operation is performed at 17 times and the verify operation is performed at 4 times for each level (totally, 28 times). That is, the program operation is performed at 18 times and the verify operation is performed at 29 times even when the preliminary program operation and the detection verify operation for the preliminary program operation are contained.

As described above, according to the present embodiment, by performing the preliminary program operation prior to the write operation to the NAND memory cell array 23, the writing characteristic of the memory cell transistors MT is detected, and the standard write sequence is corrected. The correction makes it possible to reduce loops that contribute little (substantially do not contribute) to the change of the threshold voltage of the memory cell transistor MT or adjust the start timing of the verify operation for each target level. Accordingly, as compared with the case where the standard write sequence is executed, the number of the program operation and the number of the verify operation can be reduced, so that the time required for the write operation can be shortened and the speed can be increased. By increasing the speed of the write operation, the processing capacity of the semiconductor memory device can be enhanced.

Furthermore, a memory cell transistor MT having a high level (for example, "E" level) is arranged to be adjacent to a memory cell transistor MT having a low level (for example, "A" level) as the target threshold voltage level. When the voltage VPGM to be applied to the selected word line WL is successively increased from a low voltage side, following increase of the threshold voltage of memory cell transistors MT having high levels as the target level of the threshold voltage, the threshold voltage distribution of the memory cell transistors MT having low levels as the target level of the threshold voltage spreads due to a coupling phenomenon, so that reliability may degrade. In the present embodiment, in the preliminary program operation, the program operation for the memory cell transistors MT having high levels as the target level of the threshold voltage is performed antecedently, thereby achieving an effect of suppressing the coupling phenomenon and suppressing the spread of the threshold voltage distribution of memory cell transistors MT having low levels as the target level of the threshold voltage.

When it is determined from the preliminary program operation that the writing characteristic of the memory cell transistors MT is fast (the writing characteristic is in a deteriorated state), it is possible to narrow the distribution width of each of the regions Er, A, B, C, D, E, F, and G by reducing the increase amount of the voltage VPGM to be applied to the selected word line WL between loops. In this case, the reliability of the semiconductor memory device can be improved.

A memory cell group MG having a peculiar writing characteristic (the writing speed is extremely slow or the like) different from the writing characteristics of other groups can be also detected by the preliminary program operation. When it is determined that a defect may occur in such a memory cell group MG in the future, the write operation to a word line WL connected to the memory cell group MG is stopped, whereby the reliability of the semiconductor memory device can be improved.

Second Embodiment

Next, a semiconductor memory device according to a second embodiment of the present invention will be described. The semiconductor memory device of the present embodiment is different from the semiconductor memory device of the first embodiment described above in the correction method of the standard write sequence. The configuration of the semiconductor memory device of the embodiment is similar to the configuration of the semiconductor memory device of the first embodiment described above. Therefore, the description on the similar configuration will be omitted, and only differences from the first embodiment will be described below.

The write operation in the present embodiment is similar to the write operation in the first embodiment described with reference to FIG. 15, but different from the write operation in the first embodiment in the detailed execution content of each step. The procedure of the write operation in the present embodiment will be hereinafter described specifically with reference to FIG. 15.

First, the preliminary program operation is performed (Si). In the first embodiment, the preliminary program operation is performed on the memory cell transistors MT having high levels as the target level of the threshold voltage. On the other hand, in the present embodiment, the preliminary program operation is performed by applying the voltage VPGM of the first loop to the selected word line for the memory cell transistors MT of the "A" level to the "G" level.

Next, the detection verify operation for the preliminary program operation is performed to detect the writing characteristic (S2). The detection verify operation in S2 is performed with the "A" level.

Subsequently, the number of bits having passed the detection verify operation in S2 and the number of bits having failed the detection verify operation in S2 are detected (S3). The detection of the numbers of passing/failing bits is performed in the fail number count circuit 221 provided in the control unit 22. When the number of memory cell transistors MT having the "A" level as the target level of the threshold voltage can be calculated, the detection of the number of bits in S3 may be performed on only either the pass bits or the fail bits.

Next, the control unit 22 estimates the writing characteristic of the memory cell transistors MT based on the number of pass/fail bits detected in S3, and corrects the standard write sequence (S4). For example, in S3, when the rate of the fail bits (the rate of the fail bits to the total number of memory cell transistors MT in which the target level of the threshold voltage is "A") is larger than a preset threshold voltage, the writing characteristic is estimated to be slow.

For example, the standard write sequence is corrected such that the first and second loops of the standard write sequence are skipped and the program operation is performed from the third loop. Furthermore, the standard write sequence is also corrected such that the verify operation for each level is started with being later from the standard write sequence by two loops (See FIG. 19).

FIG. 22 shows an example of the voltage (voltage VPGM) of the selected word line in each loop during the write operation of the semiconductor memory device of the second embodiment. The horizontal axis of FIG. 22 represents the loop number in the standard write sequence.

First, in the preliminary program operation, the voltage VPGM to be applied to the selected word line WL is set to, for example, the voltage VPGM (12.0 V) of the first loop in the standard write sequence. The program operation in the first and second loops in the standard write sequence is not performed in the corrected write sequence, and the program operation is started from the third loop. The voltage VPGM to be applied to the selected word line WL in the third loop of the standard write sequence is set to 13.0 V, but increased or decreased by ±α (α≥0) through the correction. Thereafter, the voltage VPGM to be applied to the word line WL is increased/decreased by ±α (α≥0) from the fourth loop to the nineteenth loop as the final loop in the standard write sequence through the correction.

Figure 23:
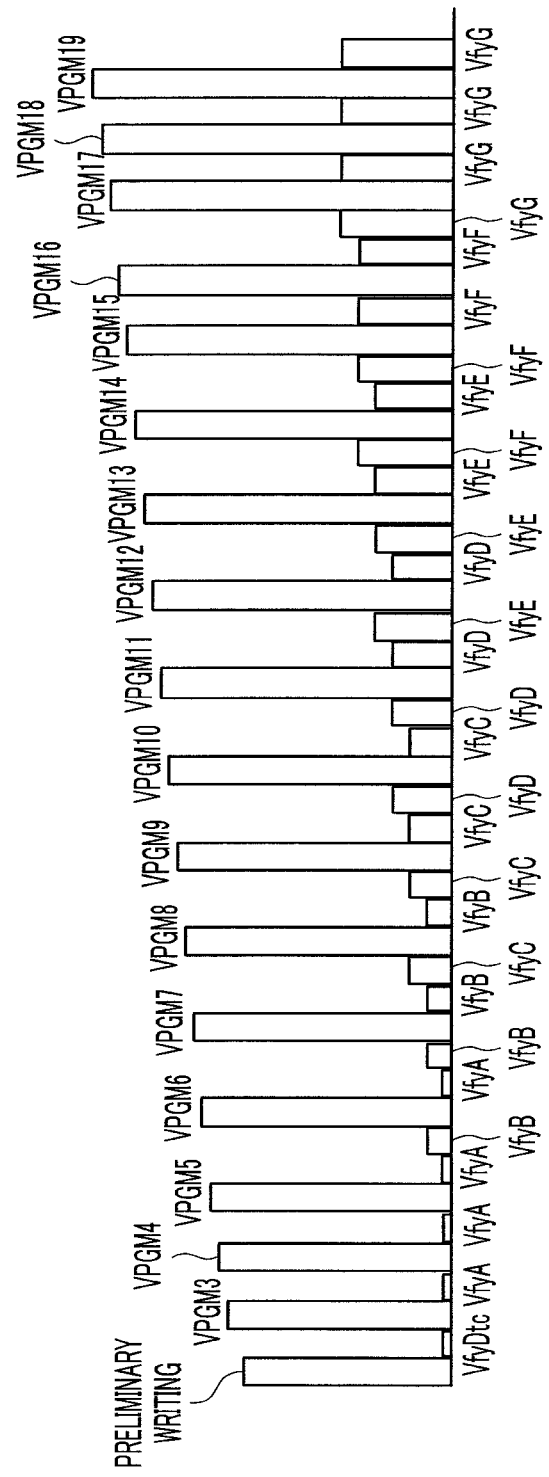
FIG. 23 is a diagram showing an example of the timings of a program operation and a verify operation during the write operation of the semiconductor storage device in the second embodiment.

FIG. 23 shows the timings of the program operation and the verify operation during the above-described write operation. First, the preliminary program operation and the detection verify operation are performed. As a result, the standard write sequence is corrected and executed from the third loop in the standard write sequence. In the third and fourth loops of the standard write sequence, only the verify operation for the "A" level is performed. That is, the verify operation is performed once for one program operation. In the fifth and sixth loops of the standard write sequence, the verify operation for the "A" level and the verify operation for the "B" level are performed. That is, the verify operation is performed twice for one program operation. In the seventh loop of the standard write sequence, the verify operation for the "B" level and the verify operation for the "C" level are performed. That is, the verify operation is performed twice for one program operation.

Thereafter, the verify operation for a set predetermined level is performed for one program operation. Eventually, in the seventeen loops, the program operation is performed at 17 times and the verify operation is performed at 4 times for each level (totally, 28 times). That is, the program operation is performed at 18 times and the verify operation is performed at 29 times even when the preliminary program and the detection verify operation are contained.

Finally, the control unit 22 outputs a control signal based on the corrected write sequence to the sense unit 24 and the row decoder 25, and the write operation to the NAND memory cell array 23 is continued (S5).

As described above, according to the present embodiment, for the memory cell transistor MT having the lowest "A" level as the target level of the threshold voltage, the voltage VPGM of the first loop is applied to the selected word line to perform the preliminary program operation and detect the writing characteristic of the memory cell transistors MT, and the standard write sequence is corrected, whereby an effect similar to the effect of the first embodiment can be obtained. As a result, since the first loop of the standard write sequence can be diverted as the preliminary program operation, it is unnecessary to add a special step to the standard write sequence. Furthermore, in the preliminary program operation, it is unnecessary to charge the voltage VPGM to be applied to the selected word line WL to a high voltage, and an effect of reducing power consumption can be also obtained.

Third Embodiment

Next, a semiconductor memory device according to a third embodiment of the present invention will be described. The semiconductor memory device of the present embodiment is different from the semiconductor memory device of the first embodiment described above in the correction method of the standard write sequence. Since the configuration of the semiconductor memory device of the present embodiment is similar to the configuration of the semiconductor memory device of the first embodiment described above, description on the similar configuration is omitted, and only differences from the first embodiment will be described hereinafter.

The write operation in the present embodiment is similar to the write operation in the first embodiment described with reference to FIG. 15, but the detailed execution content of each step is different therebetween. The procedure of the write operation in the present embodiment will be hereinafter specifically described with reference to FIG. 15.

First, the preliminary program operation is performed (Si). In the first embodiment, the preliminary program operation is performed once on the memory cell transistor MT having high target level as the threshold voltage. In contrast, in the present embodiment, the preliminary program operation of different target levels is performed twice. In the present embodiment, as the first program operation, the voltage VPGM of the first loop is applied to the selected word line for the memory cell transistors MT having the "A" level to the "G" level. Subsequently, as the second preliminary program operation, the voltage VPGM of the ninth loop is applied to the selected word line for the memory cell transistors MT having the "E" level to the "G" level.

Next, the detection verify operation for the preliminary program operation is performed to detect the writing characteristic (S2). The detection verify operation in S2 is performed with the "E" level.

Subsequently, the number of bits having passed the detection verify operation in S2 and the number of bits having failed the detection verify operation are detected (S3). The detection of the numbers of pass/fail bits is performed in the fail number count circuit 221 provided in the control unit 22. When the number of memory cell transistors MT having the target level of "E" as the threshold voltage can be calculated, the detection of the number of bits in S3 may be performed on only either the pass bits or the fail bits.

Next, the control unit 22 estimates the writing characteristic of the memory cell transistors MT based on the numbers of pass/fail bits detected in S3, and corrects the standard write sequence (S4). For example, in S3, when the rate of the fail bits (the rate of the fail bits to the total number of the memory cell transistors MT having the target level "E" of the threshold voltage) is larger than a preset threshold voltage, it is estimated that the writing characteristic is slow.

For example, the write sequence is corrected such that the first and second loops of the standard write sequence are skipped and the program operation is performed from the third loop. Furthermore, the write sequence is also corrected so that the verify operation of each level is started at a timing which is later from the standard write sequence by two loops (see FIG. 19).

FIG. 24 shows an example of the voltage (voltage VPGM) of the selected word line in each loop during the write operation of the semiconductor memory device of the third embodiment.

First, the voltage VPGM to be applied to the selected word line WL in the first preliminary program operation is set to, for example, the voltage VPGM (12.0 V) of the first loop in the standard write sequence. Next, the voltage VPGM to be applied to the selected word line WL in the second preliminary program operation is set to, for example, the voltage VPGM (16.0 V) of the ninth loop in the standard write sequence. The program operation of the first and second loops in the standard write sequence is not performed in the corrected write sequence, and the program operation is started from the third loop. The voltage VPGM to be applied to the word line WL is increased/decreased by $\pm\alpha$ ($\alpha \geq 0$) from the third loop until the 19th loop as the final loop in the standard write sequence.

Figure 25:
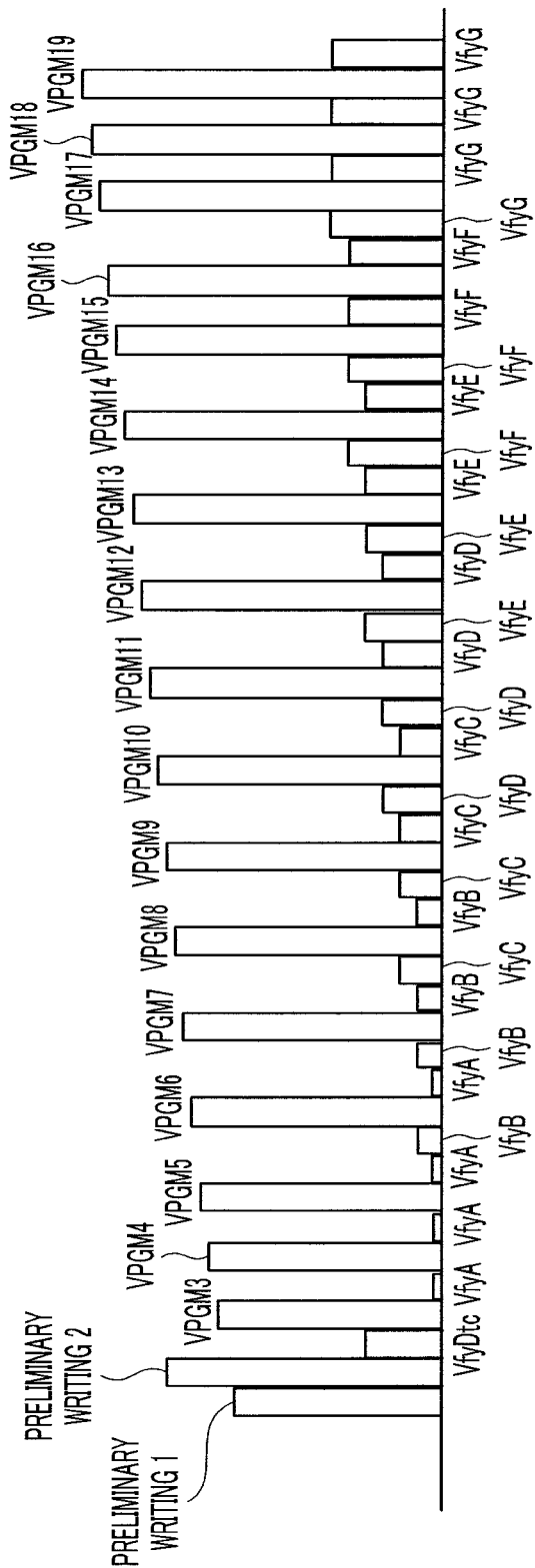
FIG. 25 is a diagram showing an example of the timings of a program operation and a verify operation during the wiring operation of the semiconductor memory device in the third embodiment.

FIG. 25 shows the timings of the program operation and the verify operation during the above-described write operation. First, the preliminary program operation of two times and the detection verify operation for the preliminary program operation are performed. As a result, the standard write sequence is corrected and performed from the third loop of the standard write sequence. The verify operation for a set predetermined level is performed for one program operation from the third loop until the nineteenth loop. Eventually, in the seventeen loops, the program operation is performed at 17 times, and the verify operation is performed at 4 times for each level (totally, 28 times). That is, the program operation is performed at 19 times and the verify operation is performed at 29 times even when the preliminary program operation and the verify operation for the preliminary program operation are contained.

Finally, the control unit 22 outputs a control signal based on the corrected write sequence to the sense unit 24 and the row decoder 25, and the write operation to the NAND memory cell array 23 is continued (S5).

As described above, according to the present embodiment, the voltage VPGM of the first loop is first applied to the selected word line for memory cell transistors MT of the "A" level to "G" level to perform the first preliminary program operation. Then, the voltage VPGM having a high level (for example, the voltage VPGM of the ninth loop) is applied to memory cell transistors MT having high levels as the target level of the threshold voltage to perform the second preliminary program operation. Subsequently, the writing characteristic of the memory cell transistors MT is detected, and the standard write sequence is corrected, whereby an effect similar to the effect of the first embodiment can be obtained. In addition, it is also possible to obtain an effect of suppressing the spread of the threshold voltage distribution of memory cell transistors MT having low levels as the target level of the threshold voltage due to the coupling phenomenon.

Fourth Embodiment

Figure 26:
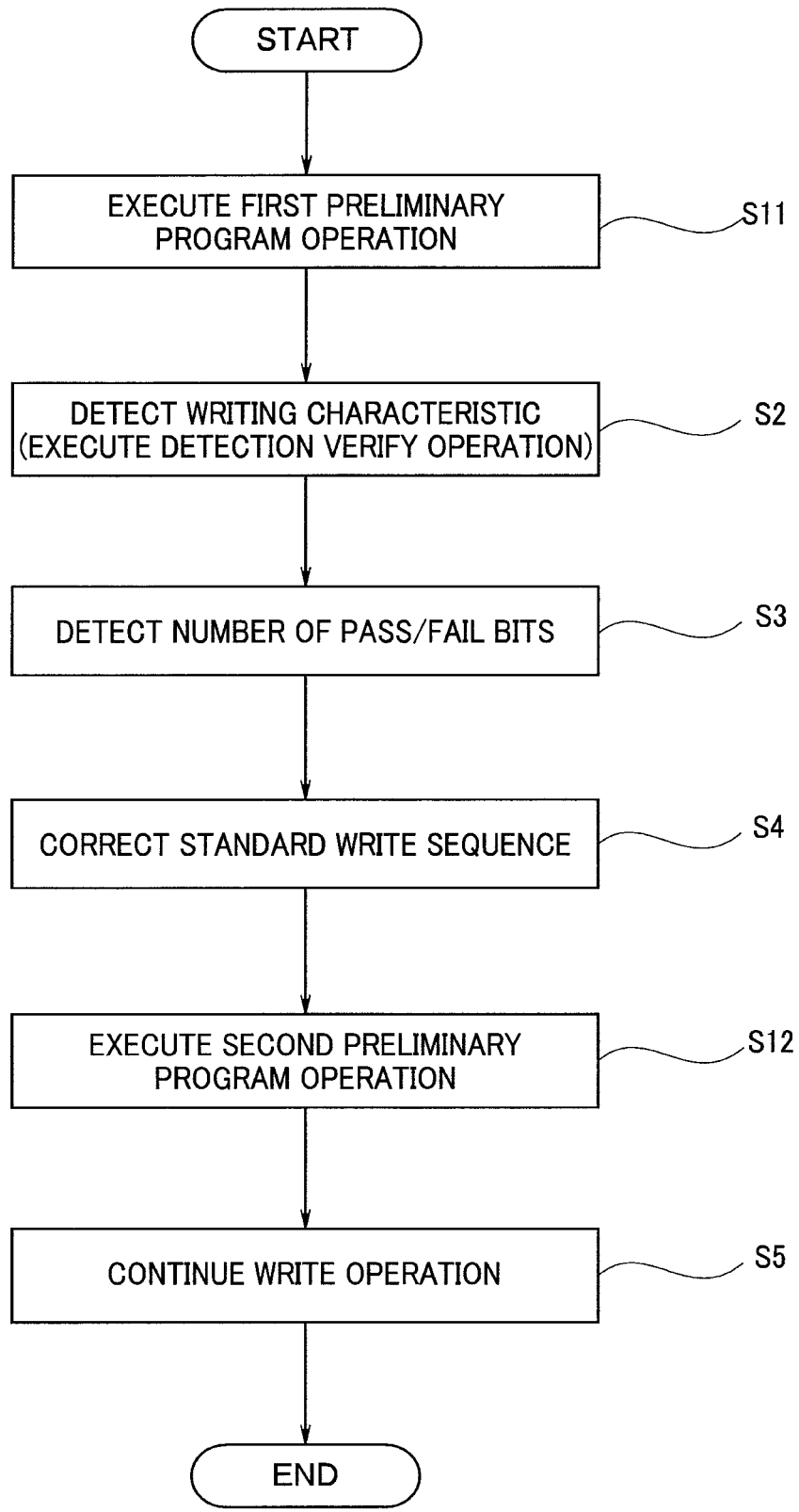
FIG. 26 is a flowchart showing an example of the procedure of a write operation in a fourth embodiment.

Next, a semiconductor memory device according to a fourth embodiment of the present invention will be described. The semiconductor memory device of the present embodiment is different from the semiconductor memory device of the first embodiment described above in the method of correcting the standard write sequence. Since the configuration of the semiconductor memory device of the present embodiment is similar to the configuration of the semiconductor memory device of the first embodiment described above, the description on the configuration of the present embodiment will be omitted, and only differences from the first embodiment will be described hereinafter. Thereafter, by using FIG. 26, the procedure of the write operation in the present embodiment will be hereinafter specifically described.

First, a first preliminary program operation is performed (S11). In the first embodiment, the preliminary program operation is performed once for the memory cell transistors MT having high target levels as the threshold voltage. In contrast, in the present embodiment, the preliminary program operation of different target levels is performed twice. Furthermore, in the present embodiment, the detection of the writing characteristic is performed between the first preliminary program operation and the second preliminary program operation. In S11, as the first preliminary program operation, the voltage VPGM of the first loop is applied to the selected word line for the memory cell transistors MT of the "A" level to the "G" level.

Next, a detection verify operation for the first preliminary program operation is performed to detect a write characteristic (S2). The detection verify operation in S2 is performed with the "A" level.

Subsequently, the number of bits having passed the detection verify operation in S2 and the number of bits having failed the detection verify operation in S2 are detected (S3). The detection of the number of pass/fail bits is performed in the fail number count circuit 221 provided in the control unit 22. When the number of memory cell transistors MT having the target level "A" of the threshold voltage can be calculated, the detection of the number of bits in S3 may be performed on either the pass bits or the fail bits.

Next, the control unit 22 estimates the writing characteristic of the memory cell transistors MT based on the number of pass/fail bits detected in S3, and corrects the standard write sequence (S4). For example, in S3, when the rate of the fail bits (the rate of the fail bits to the total number of memory cell transistors MT having the target level "A" of the threshold voltage) is larger than a preset threshold voltage, it is estimated that the writing characteristic is slow.

For example, the standard write sequence is corrected such that the first and second loops of the standard write sequence are skipped and the program operation is performed from the third loop. Furthermore, the standard write sequence is corrected such that the verify operation for each level is started at a timing which is delayed from the standard write sequence by two loops (see FIG. 19).

Subsequently, as the second preliminary program operation, the voltage VPGM of the ninth loop is applied to the selected word line for the memory cell transistors MT of the "E" level to "G" level (S12). The detection verify operation for the second preliminary program operation may be performed or may not be performed. The voltage VPGM to be applied to the selected word line in this step is changed in accordance with the correction of the standard write sequence in S3. For example, when the voltage VPGM of the ninth loop is corrected from 16.0 V to 16.1 V, the voltage VPGM to be applied to the selected word line as the second preliminary program operation in this step is set to 16.1 V.

FIG. 27 shows an example of the voltage (voltage VPGM) of the selected word line in each loop during the write operation of the semiconductor memory device of the fourth embodiment.

First, the voltage VPGM to be applied to the selected word line WL in the first preliminary program operation is set to, for example, the voltage VPGM (12.0 V) of the first loop in the standard write sequence. Next, the voltage VPGM to be applied to the selected word line WL in the second preliminary program operation is set to, for example, the corrected voltage VPGM (16.0±α V) of the ninth loop in the standard write sequence. The program operation of the first loop and the second loop in the standard write sequence is not performed in the corrected write sequence, and the program operation is started from the third loop. The voltage VPGM to be applied to the word line WL is increased/decreased by ±α (α≥0) from the third loop until the 19th loop as the final loop in the standard write sequence through the correction.

FIG. 28 shows the timings of the program operation and the verify operation during the above-described write operation. First, the first preliminary program operation, the detection verify operation for the first preliminary program operation, and the second preliminary program operation are performed. As a result, the standard write sequence is corrected and performed from the third loop in the standard write sequence. From the third loop to the nineteenth loop, the verify operation for a set predetermined level is performed for one program operation. Eventually, in the seventeen loops, the program operation is performed at 17 times and the verify operation is performed at 4 times for each level (totally, 28 times). That is, the program operation is performed at 19 times and the verify operation is performed at 29 even when the preliminary program operation and the detection verify operation for the preliminary program operation.

Finally, the control unit 22 outputs a control signal based on the corrected write sequence to the sense unit 24 and the row decoder 25, and the write operation to the NAND memory cell array 23 is continued (S5).

As described above, according to the present embodiment, the voltage VPGM of the first loop is applied to the selected word line for the memory cell transistors MT of the "A" level to the "G" level to perform the first preliminary program and detect the writing characteristic of the memory cell transistors MT, and the standard program sequence is corrected. At this time, the voltage to be applied in the second preliminary program operation is also corrected. Then, the voltage VPGM having a high level (for example, the voltage VPGM of the ninth loop) is applied to the memory cell transistors MT having high target levels of the threshold voltage to perform the second preliminary program operation. First, by performing these operations, an effect similar to the effect of the first embodiment can be obtained. Furthermore, by correcting the voltage to be applied in the second preliminary program operation, the effect of suppressing spreading of the threshold voltage distribution of the memory cell transistor MT having low target levels of the threshold voltage due to the coupling phenomenon is enhanced.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a plurality of memory cells each of which can be set to any one of different threshold voltages, the threshold voltages including:
a first threshold voltage,
a second threshold voltage higher than the first threshold voltage,
a third threshold voltage higher than the second threshold voltage,
a fourth threshold voltage higher than the third threshold voltage,
a fifth threshold voltage higher than the fourth threshold voltage,
a sixth threshold voltage higher than the fifth threshold voltage,
a seventh threshold voltage higher than the sixth threshold voltage, and
an eighth threshold voltage higher than the seventh threshold voltage;

a plurality of bit lines connected to the plurality of memory cells respectively;

a word line connected to gates of the plurality of memory cells; and a control unit configured to execute a write sequence to write predetermined data into the memory cells, the write sequence including:

a plurality of loops each comprising:

a program operation to apply a program voltage to the word line while applying a first voltage or a second voltage higher than the first voltage to each of the bit lines, thereby increasing threshold voltages of the respective memory cells according to data, and a verify operation to apply a verify voltage to the word line, thereby verifying whether the threshold voltages of the memory cells have been increased to respective target levels, wherein prior to execution of the write sequence, the control unit performs a first preliminary program operation to apply a first preliminary program voltage while applying the first voltage to a part of the memory cells and applying the second voltage to the remaining part of the memory cells, the first preliminary program voltage being the same with the program voltage at the first loop of the write sequence, after the first preliminary program operation. a second preliminary program operation to apply a second preliminary program voltage while applying the first voltage to a part of the part of the memory cells and applying the second voltage to the remaining part of the memory cells, the second preliminary program voltage being higher than the first preliminary program voltage and the same with the program voltage at the second or subsequent loop of the write sequence, after the second preliminary program operation, a detection verify operation to apply a detection verify voltage to the word line, the detection verify voltage being the same with the verify voltage at the second or subsequent loop of the write sequence, and a sequence correction operation to correct the write sequence based on a fail rate calculated as a result of the detection verify operation.

2. The semiconductor memory device according to claim 1, wherein the sequence correction operation adjusts a number of the loops that is set in the write sequence.

3. The semiconductor memory device according to claim 1, wherein the sequence correction operation adjusts the loops which are set in the write sequence.

4. The semiconductor memory device according to claim 1, wherein the sequence correction operation adjusts a program voltage to be applied to the word line in each of the loops that are set in the write sequence.

5. The semiconductor memory device according to claim 1, wherein the control unit performs the detection verify operation only once for the preliminary program operation of one time.

6. The semiconductor memory device according to claim 1, wherein the control unit performs the detection verify operation before the program operation performed last in the preliminary program operation.

7. A semiconductor memory device, comprising:

a memory cell array including a plurality of memory cells each of which can be set to any one of different threshold voltages, the threshold voltages including:

a first threshold voltage, a second threshold voltage higher than the first threshold voltage, a third threshold voltage higher than the second threshold voltage, a fourth threshold voltage higher than the third threshold voltage, a fifth threshold voltage higher than the fourth threshold voltage, a sixth threshold voltage higher than the fifth threshold voltage, a seventh threshold voltage higher than the sixth threshold voltage, and an eighth threshold voltage higher than the seventh threshold voltage;

a plurality of bit lines connected to the plurality of memory cells respectively;

a word line connected to gates of the plurality of memory cells; and a control unit configured to execute a write sequence to write predetermined data into the memory cells, the write sequence including:

a plurality of loops each comprising:

a program operation to apply a program voltage to the word line while applying a first voltage or a second voltage higher than the first voltage to each of the bit lines, thereby increasing threshold voltages of the respective memory cells according to data, and a verify operation to apply a verify voltage to the word line. thereby verifying whether the threshold voltages of the memory cells have been increased to respective target levels, wherein prior to execution of the write sequence, the control unit performs:

a first preliminary program operation to apply a first preliminary program voltage while applying the first voltage to a part of the memory cells and applying the second voltage to the remaining part of the memory cells, the first preliminary program voltage being the same with the program voltage at the first loop of the write sequence, after the first preliminary program operation, a detection verify operation to apply a detection verify voltage to the word line. the detection verify voltage being the same with the verify voltage at the first loop of the write sequence, after the detection verify operation, a second preliminary program operation to apply a second preliminary program voltage while applying the first voltage to a part of the part of the memory cells and applying the second voltage to the remaining part of the memory cells, the second preliminary program voltage being higher than the first preliminary program voltage and set based on a result of performing the detection verify operation, and a sequence correction operation to correct the write sequence based on a fail rate calculated as a result of the detection verify operation.

* * * * *